(12) United States Patent
Fazio et al.

(10) Patent No.: US 6,518,618 B1
(45) Date of Patent: Feb. 11, 2003

(54) INTEGRATED MEMORY CELL AND METHOD OF FABRICATION

(75) Inventors: Albert Fazio, Los Gatos, CA (US); Krishna Parat, Palo Alto, CA (US); Glen Wada, Fremont, CA (US); Neal Mielke, Los Altos Hills, CA (US); Rex Stone, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/454,683

(22) Filed: Dec. 3, 1999

(51) Int. Cl.⁷ .............................................. H01L 29/72
(52) U.S. Cl. ................. 257/315; 257/333; 257/336; 257/344; 257/371; 257/387; 257/389; 257/412
(58) Field of Search ................................ 257/315, 333, 257/336, 344, 371, 387, 389, 412

(56) References Cited

U.S. PATENT DOCUMENTS

| | | | |
|---|---|---|---|
| 3,660,819 A | 5/1972 | Frohman-Bentchkowsky | |
| 3,728,695 A | 4/1973 | Frohman-Bentchkowsky | |
| 3,744,036 A | 7/1973 | Frohman-Bentchkowsky | |
| 3,755,721 A | 8/1973 | Frohman-Bentchkowsky | |
| 4,203,158 A | 5/1980 | Frohman-Bentchkowsky | |
| 5,260,593 A | 11/1993 | Lee | |
| 5,293,512 A | 3/1994 | Nishigoori et al. | |
| 5,511,020 A | 4/1996 | Hu et al. | |
| 5,616,942 A | 4/1997 | Song | |
| 5,650,649 A | 7/1997 | Tsukiji | |
| 5,766,997 A | 6/1998 | Takeuchi | |
| 5,864,157 A | * 1/1999 | Fu | 257/315 |
| 5,901,084 A | 5/1999 | Ohnakado | |
| 6,008,112 A | 12/1999 | Acocella et al. | |
| 6,060,360 A | 5/2000 | Lin et al. | |
| 6,060,741 A | 5/2000 | Huang | |
| 6,097,070 A | * 8/2000 | Mandelman et al. | 257/412 |
| 6,201,275 B1 | * 3/2001 | Kawasaki et al. | 257/315 |

FOREIGN PATENT DOCUMENTS

| | | | |
|---|---|---|---|
| DE | 4114166 A1 | 2/1992 | |
| EP | 0 085 551 | 8/1983 | |
| EP | 0085551 | * 10/1983 | 257/315 |
| EP | 0649172 A2 | 4/1995 | |
| GB | 1383981 | 2/1975 | |
| JP | 03198377 | 8/1991 | |
| JP | 09129757 | 5/1997 | |
| JP | 09260517 | 10/1997 | |
| JP | 10135357 | 5/1998 | |

OTHER PUBLICATIONS

IBM Tech. Dis. Bul., vol. 36, No. 02, Feb 1993, "Planarized NVRAM Cell with Self-aligned BL-BL and WL-BL Isolations".*

International Search Report, PCT/US00/22784, Aug. 17, 2000.

International Written Opinion, PCT/US00/22784, Aug. 17, 2000.

C. Salm et al. "Gate Current and Oxide Reliability in p+ Poly MOS Capacitors with Poly-Si and Poly-Ge0.3 Si0.7 Gate Material", IEEE Electron Device Letters, vol. 19, No. 7, Jul. 1998, pp. 213–215.

(List continued on next page.)

Primary Examiner—Edward Wojciechowicz
(74) Attorney, Agent, or Firm—Blakely, Sokoloff, Taylor & Zafman LLP

(57) ABSTRACT

A nonvolatile memory cell comprising a pair of spaced apart shallow trench isolation regions formed in a substrate and defining a substrate active region. A tunnel dielectric is formed on the substrate active region. A floating gate is formed on the tunnel dielectric and is self aligned between the spaced apart shallow trench isolation regions. A dielectric layer is formed on the floating gate and a control gate formed on the dielectric layer. A source region and a drain region are formed in the substrate active region on opposite sides of the floating gate.

9 Claims, 22 Drawing Sheets

OTHER PUBLICATIONS

V.E. Houtsma et al., DC–SILC in p+ Poly MOS Capacitors with Poly–Si0.7 and Ge0.3 Gate Material, 29$^{th}$ IEEE Semiconductor Interface Specialist Conference, San Diego, CA Dec. 3–5, 1998.

Steven C. Chung et al., "A Novel High Performance and Reliability p–Type Floating Gate N–Channel Flash EEPROM", 1999 Symposium on VLSI Technology Digest of Technical Papers.

Ying Shi et al., "Polarity Dependent Gate Tunneling Currents in Dual–Gate CMOSFETs" Abstracts, Center for Microelectronic Materials & Structures and Dept of Electrical Engineering, Yale University, New Haven, CT, IEEE Member.

Ying Shi et al., "Polarity–Dependent Tunneling Currents and Oxide Breakdown in Dual–Gate CMOSEFTs", IEEE Transactions on Electron Devices, vol. 45, No. 11, Nov. 1998, pp. 391–393.

Ying Shi et al., "Polarity Dependent Gate Tunneling Currents in Dual–Gate CMOSFETs" IEEE Transactions on Electron Devices, vol. 45, No. 11, Nov. 1998, pp. 2355–2360.

Murray H. Woods, "An E–PROM's Integrity Starts With its Cell Structure" Intel Corporation, Santa Clara, CA, Aug. 14, 1980.

* cited by examiner

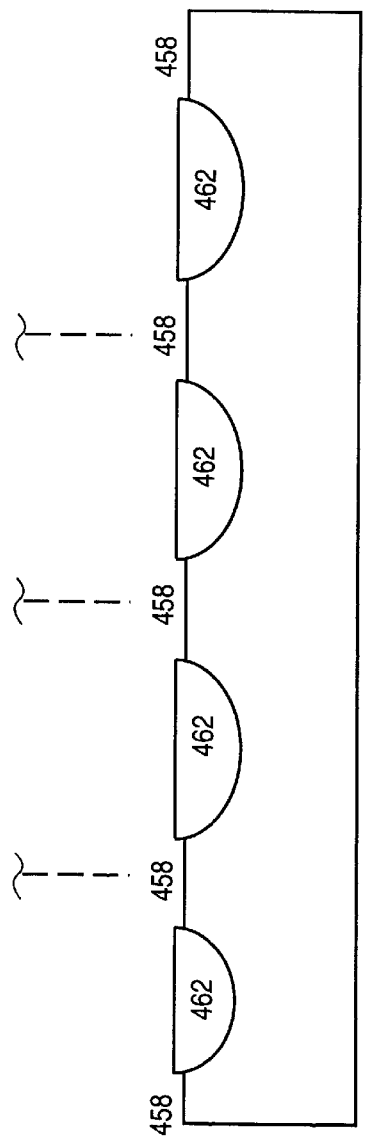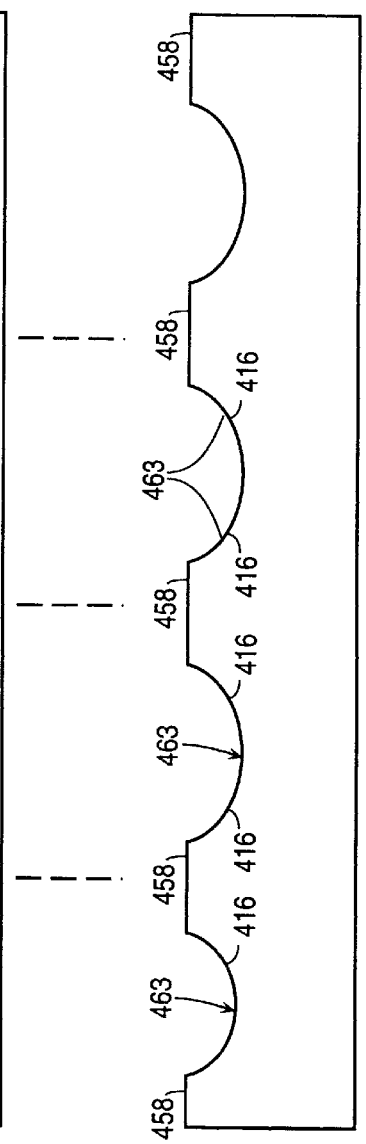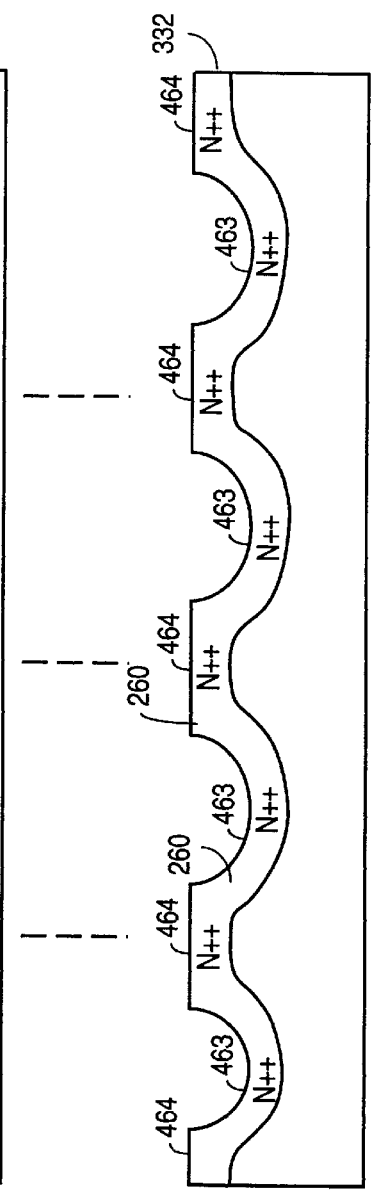

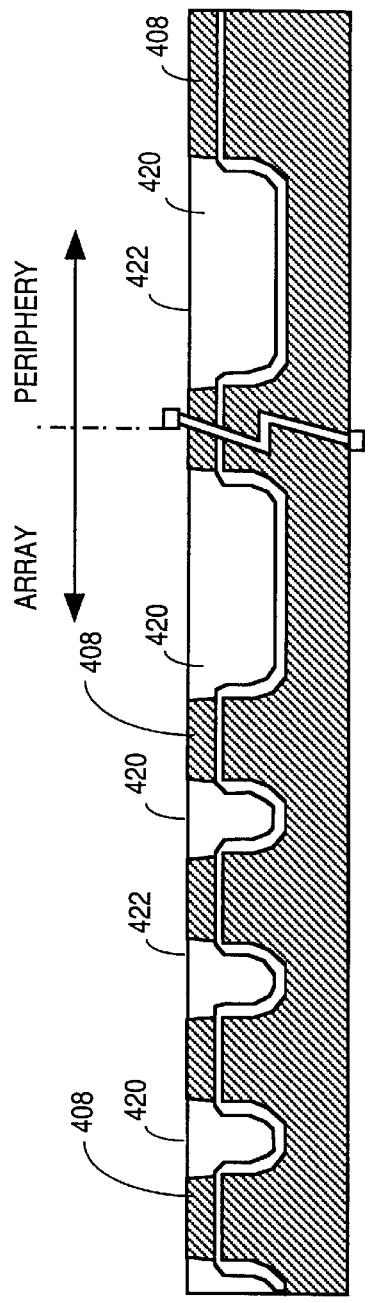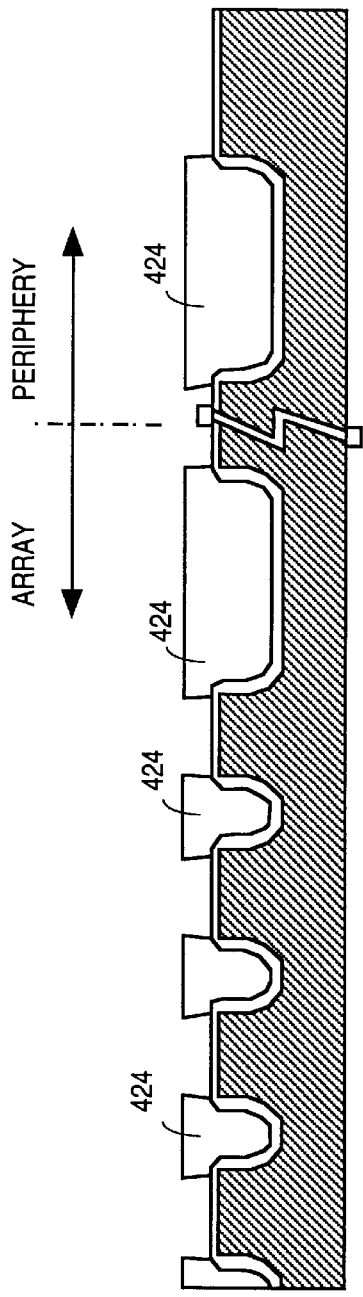

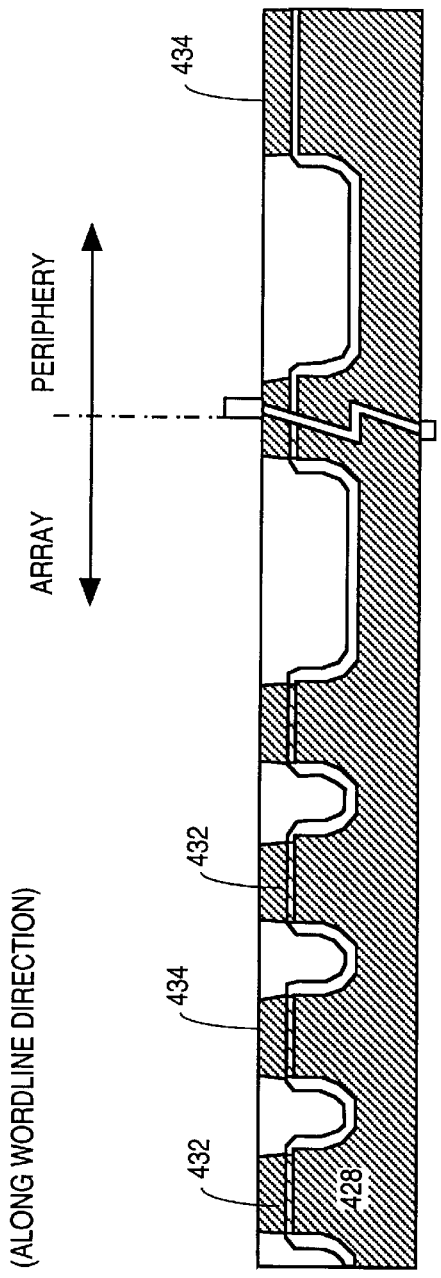
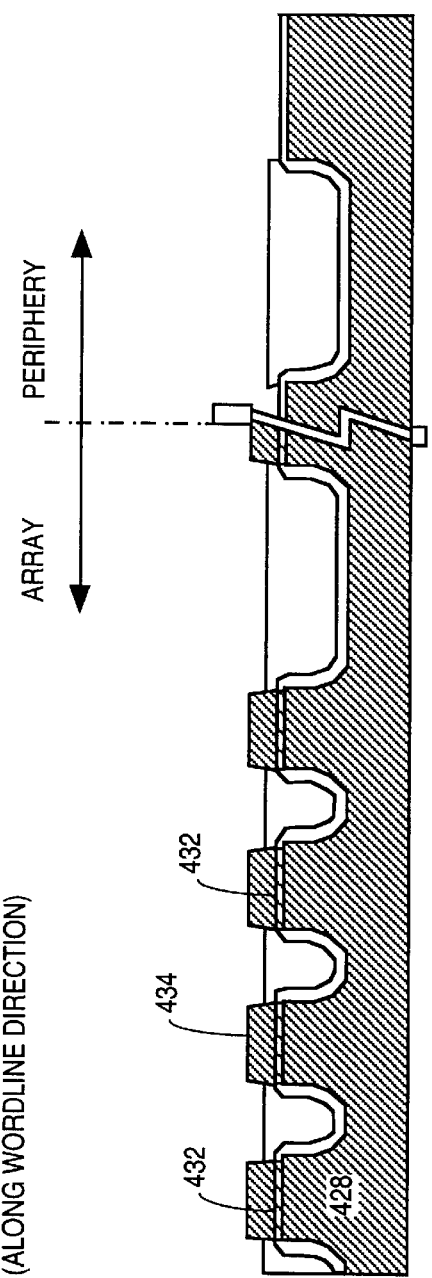

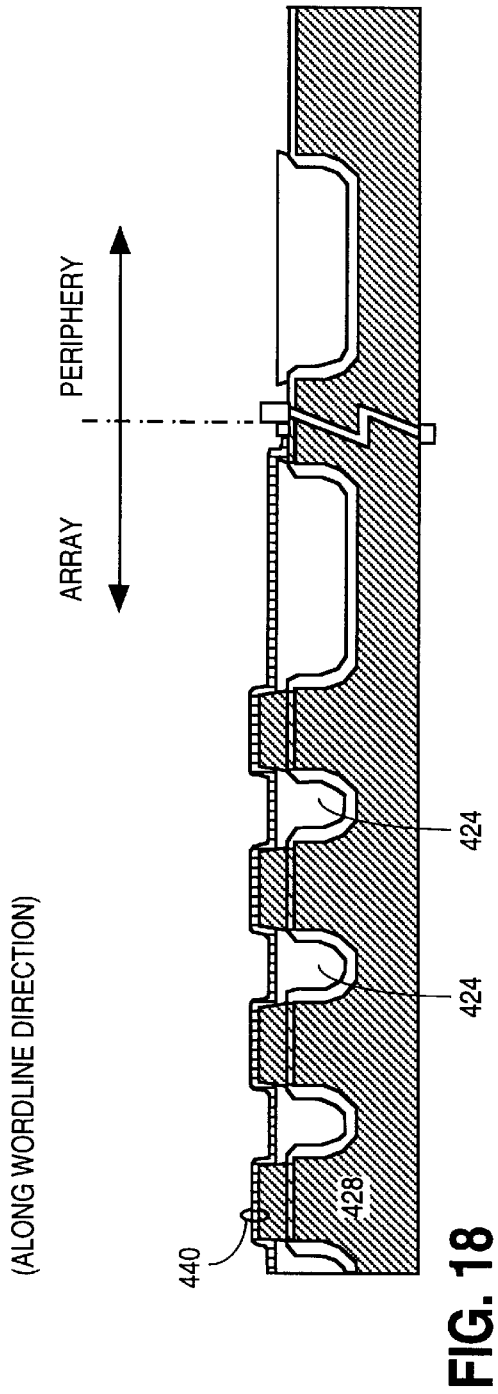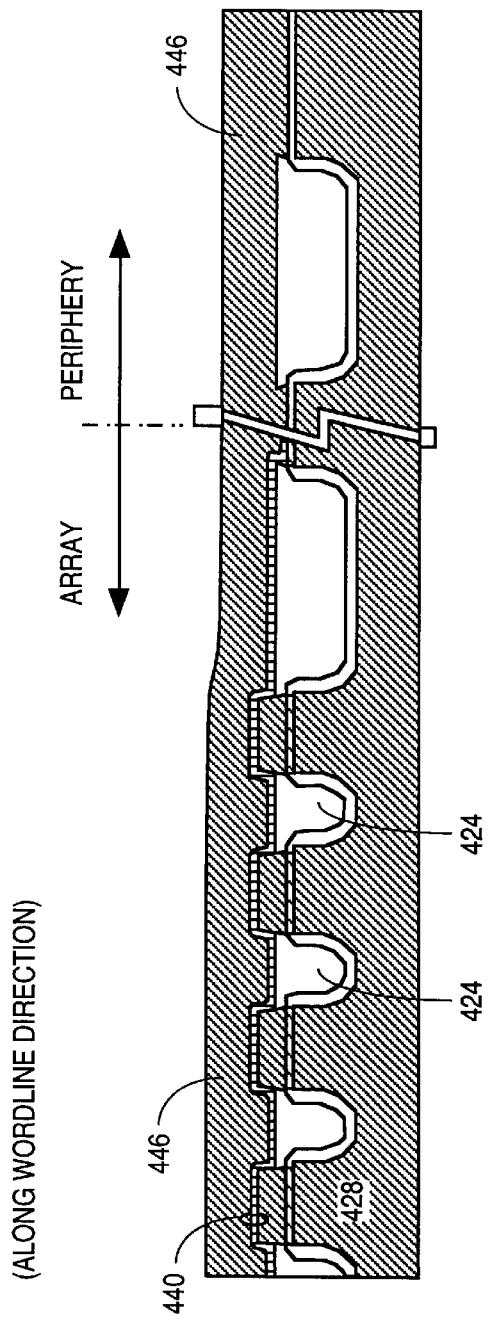

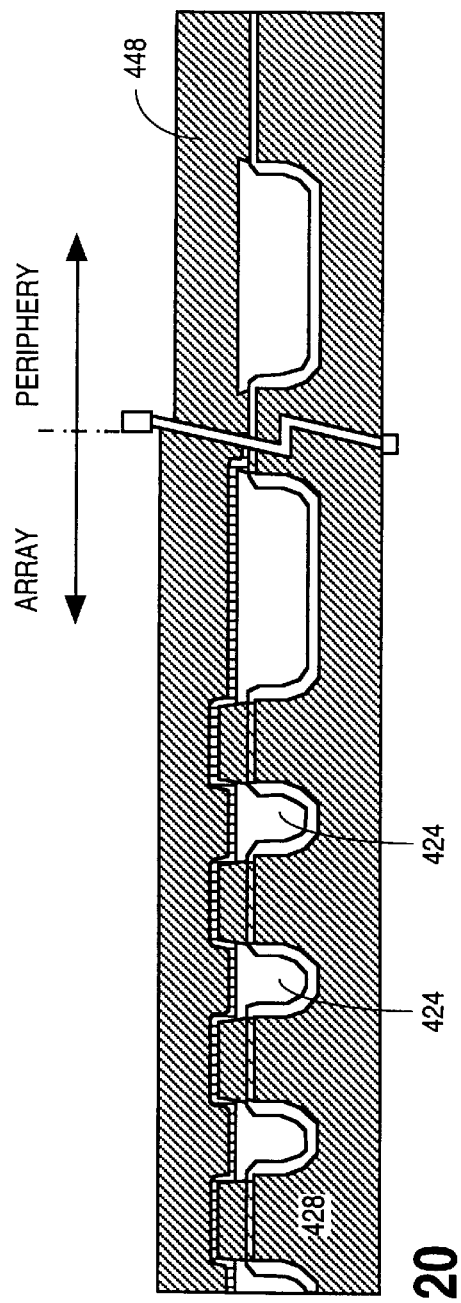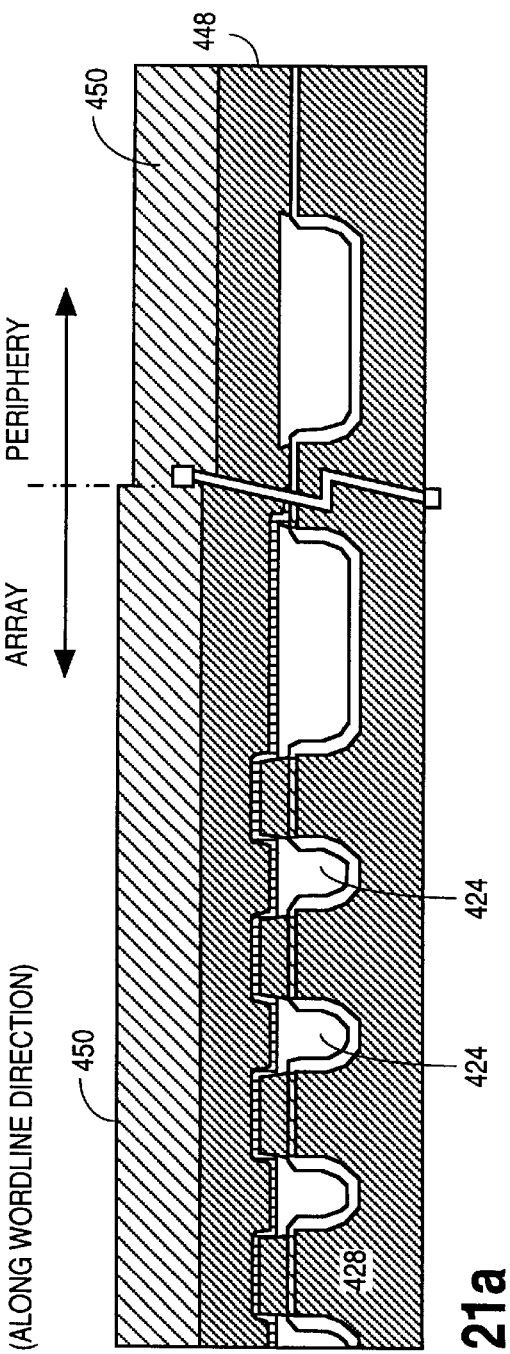

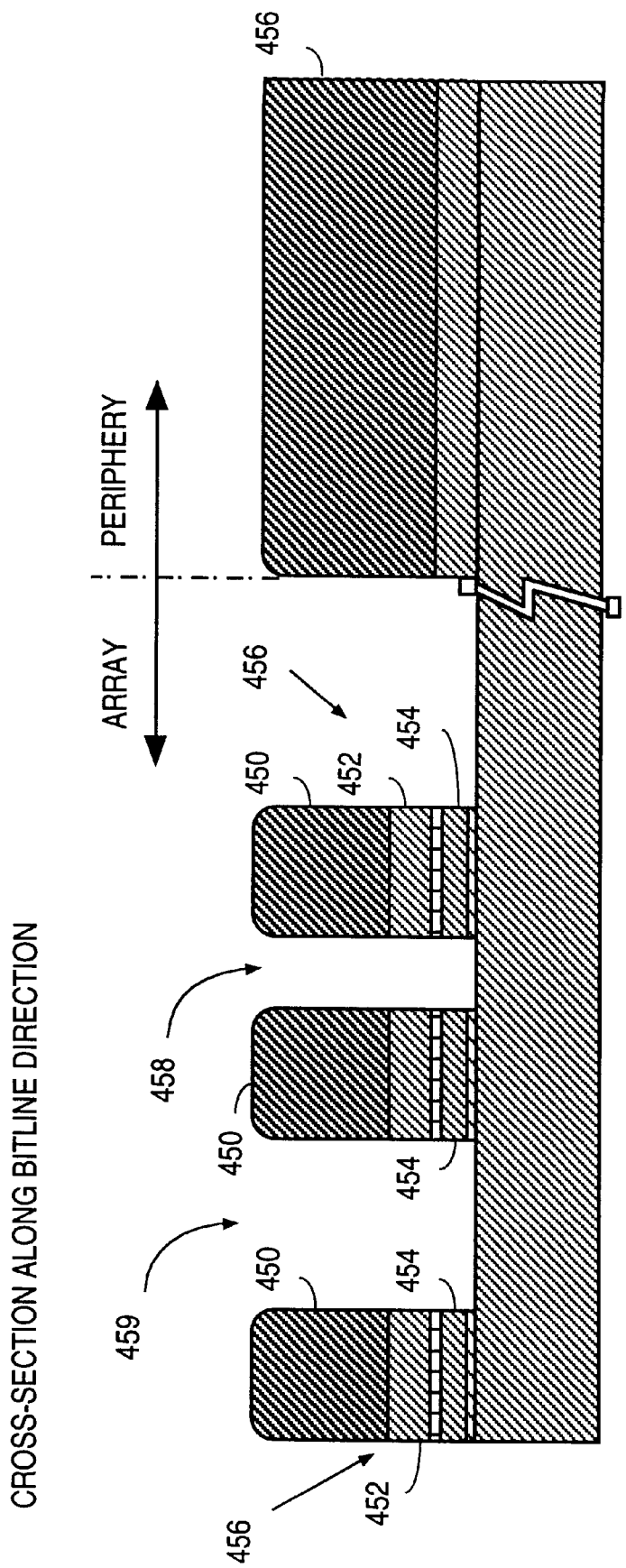

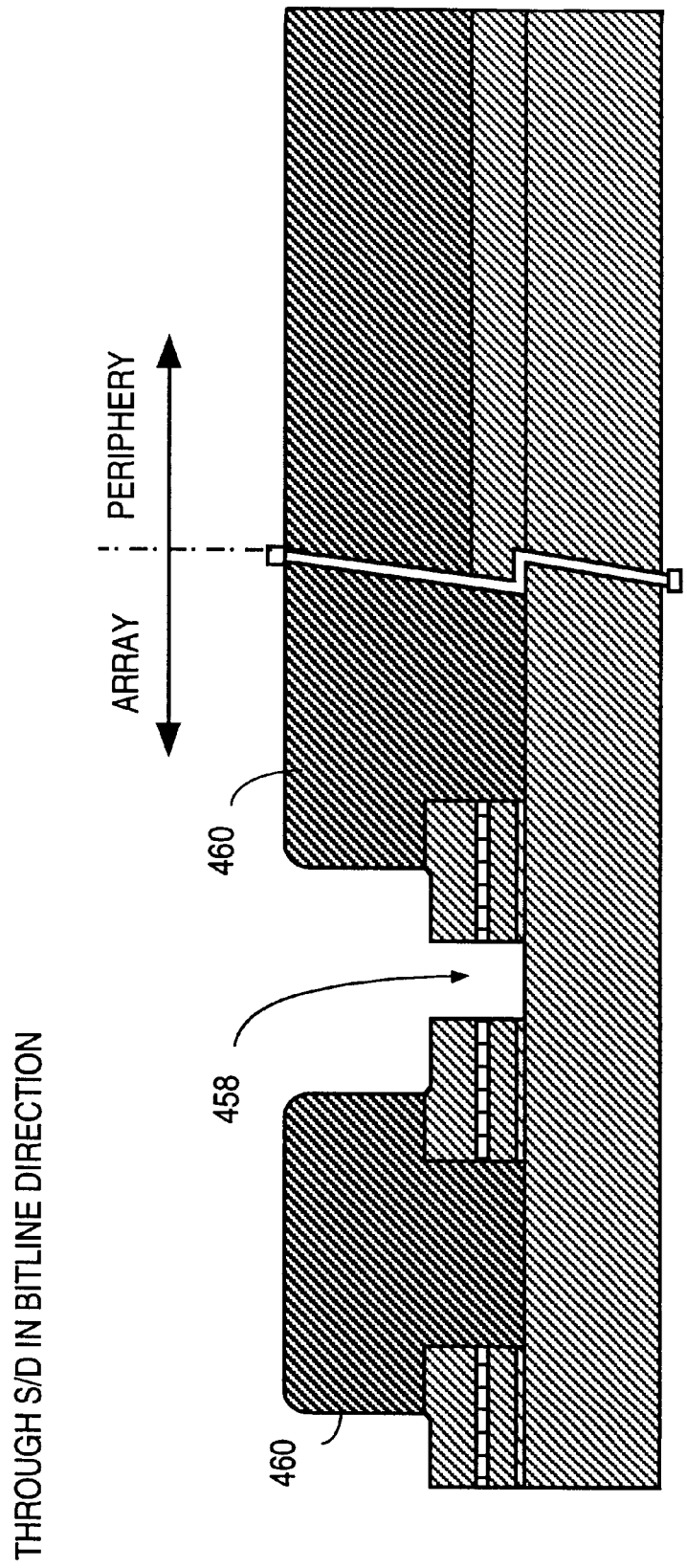

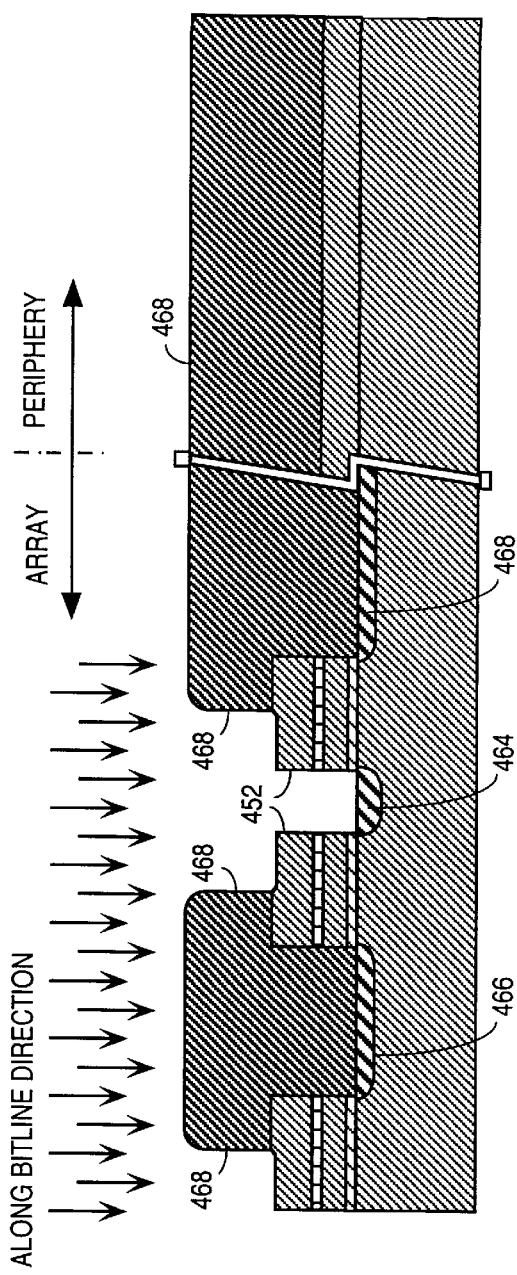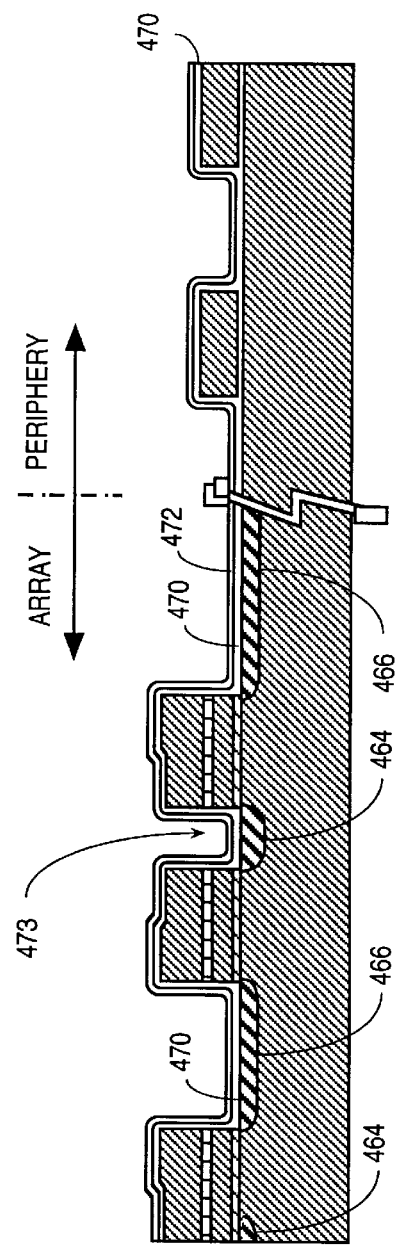
FIG. 24
FIG. 25

ALONG BITLINE DIRECTION

ALONG BITLINE DIRECTION

INTEGRATED MEMORY CELL AND METHOD OF FABRICATION

BACKGROUND OF THE INVENTION

1. Field of the Invention

The present invention relates to the field of semiconductor manufacturing and more specifically to a nonvolatile memory cell and its method of fabrication.

2. Discussion of Related Art

A conventional electrically erasable nonvolatile memory cell 100 is shown in FIG. 1. Memory cell 100 includes an n+ polysilicon floating gate 102 formed on the tunnel oxide 104 which is formed on the p-type silicon region 106. An interpoly dielectric 108 is formed on the n+ polysilicon floating gate and a control gate 110 formed on the interpoly dielectric layer 108 and a pair of n+ source/drain regions 109 are formed along laterally opposite sidewalls of floating gate electrode 102. Memory cell 100 includes fully landed metal contacts 120 which are formed entirely on the source/drain regions. To store information in memory device 100 charge is stored on floating gate 102. To erase memory device 100 charge is removed from floating gate 102.

A problem with memory storage cell 100 shown in FIG. 1, is that it has become difficult to further scale down its width and length to form smaller area cells and higher density memory circuits. For example, using contacts which are fully landed on diffusion requires a wider diffusion spacing than required for the memory cell transistor. Fully landed contacts require a large contact to gate and isolation spacing. Fully landed contacts prevent the reduction of both cell width and length. Additionally, floating gate 102 is formed by standard lithographic techniques with the cell width being limited by the minimum space resolution and the minimum registration. Another problem with cell 100 is that is suffers from charge leakage whereby electrons leak off the floating gate. In order to prevent charge leakage, the source junction is typically heavily graded leading to large under diffusion and a long gate length. Charge leakage also requires product level device optimization of voltages for balancing adequate read current verses charge loss margins thereby creating complexities in circuit design. Additionally, prevention of charge leakage also requires relatively thick tunnel oxides which in turn prevents the scaling of the device gate length.

SUMMARY OF THE INVENTION

A nonvolatile memory cell comprising a pair of spaced apart shallow trench isolation regions formed in a substrate and defining a substrate active region. A tunnel dielectric is formed on the substrate active region. A floating gate is formed on the tunnel dielectric and is self aligned between the spaced apart shallow trench isolation regions. A dielectric layer is formed on the floating gate and a control gate formed on the dielectric layer. A source region and a drain region are formed in the substrate active region on opposite sides of the floating gate.

BRIEF DESCRIPTION OF THE DRAWINGS

FIG. 3b is an illustration of a cross-sectional view taken along a wordline direction through the source rail and showing a plurality of shallow trench isolation regions.

FIG. 3c is an illustration of a cross-sectional view taken along the wordline direction through the source rail showing the removal of a portion of the shallow trench isolation regions from the substrate of FIG. 3b.

FIG. 3d is an illustration of a cross-sectional view taken along the wordline direction through the source rail showing the formation of doped regions in the substrate of FIG. 3c.

FIG. 8 is an illustration of a cross-sectional view taken along the wordline direction showing the filling of the trench isolation regions of the substrate of FIG. 7.

FIG. 9 is an illustration cross-sectional view taken along the wordline direction showing the removal of the silic on nitride and pad oxide layers from the substrate of FIG. 8.

FIG. 14 is an illustration of a cross-sectional view taken along the wordline direction showing the polishing of the floating gate material on the substrate of FIG. 13 to form self-aligned floating gates lines.

FIG. 15 is an illustration of cross-sectional view taken along the wordline direction showing the removal of the top portion of the STI from the substrate of FIG. 14.

FIG. 18 is an illustration of a cross-sectional view taken along the wordline direction showing the formation of a gate dielectric on the periphery portion of the substrate to FIG. 17.

FIG. 19 is an illustration of a cross-sectional view taken along the wordline direction showing the formation of a second polysilicon film on the substrate of FIG. 18.

FIG. 20 is an illustration of a cross-sectional view taken along the wordline direction showing the planarization of the second polysilicon layer on the substrate of FIG. 19.

FIG. 21a is an illustration of a cross-sectional view taken along the wordline direction showing the formation of a poly 2 patterning mask on the substrate of FIG. 20.

FIG. 21b is an illustration of a cross-sectional view taken along the bitline direction showing the patterning of the polysilicon layer, the interpoly dielectric and the first polysilicon lines on the substrate of FIG. 20.

FIG. 22a is an illustration of a cross-sectional view taken along the bitline direction showing the formation of a photoresist mask which reveals the portions of the silicon substrate for the shared source regions and a portion of the shallow transisolation which is to be removed.

FIG. 23 is an illustration of a cross-sectional view taken along the bitline direction showing the formation of source/drain regions in the array portion of the integrated circuit of FIG. 22a.

FIG. 24 is an illustration of a cross-sectional view taken along the bitline direction showing the formation of a graded and heavily doped source region in the substrate of FIG. 23.

FIG. 25 is an illustration of a cross-sectional view taken along the bitline direction showing the formation of a thermal oxide and a high temperature oxide over the substrate of FIG. 24.

DETAILED DESCRIPTION OF THE PRESENT INVENTION

The present invention is a novel nonvolatile memory cell and its method of fabrication. In the following description numerous specific details are set forth in order to provide a through understanding of the present invention. One of ordinary skill in the art, however, will appreciate that these specific details are not necessary in order to practice the present invention. In other instances well known semiconductor fabrication processes and techniques have not been set forth in particular detail in order to not unnecessarily obscure the present invention.

The present invention is a novel nonvolatile memory cell and its method of fabrication. The memory cell of the present invention utilizes a combination of features and process techniques which reduce the total area occupied by the cell and thereby enable the fabrication of high density memory integrated circuit. In one embodiment of the present invention the cell width is reduced to less than 550 nm by the combination of a self-aligned floating gate, unlanded contacts, and shallow trench isolation (STI). In another embodiment of the present invention the cell length is reduced to less than 750 nm by a combination of a high work function floating gate, a continuous source rail, and unlanded contacts. The features and techniques of the present invention can form manufacturable sub 0.35 $\mu m^2$ nonvolatile memory cells with 0.18 $\mu m$ technology.

Figure 1:
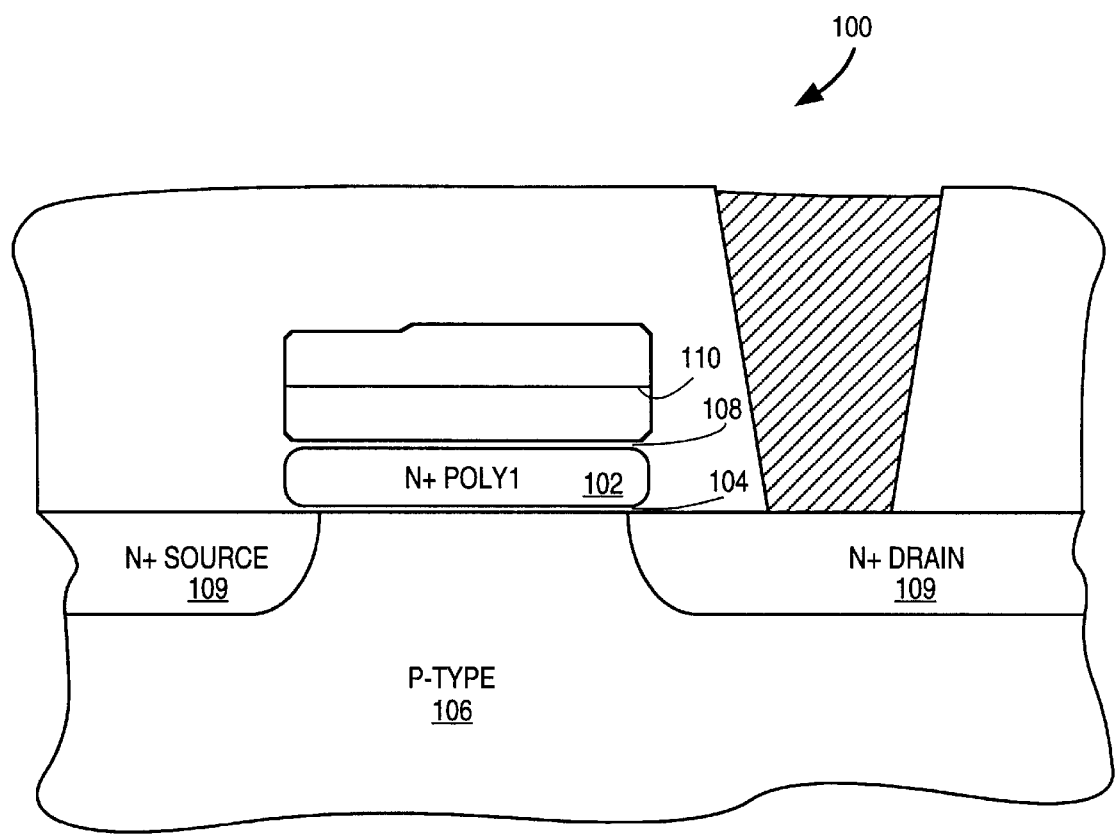
FIG. 1 is an illustration of a cross-sectional view of a conventional electrically erasable nonvolatile memory device.
Figure 2A:
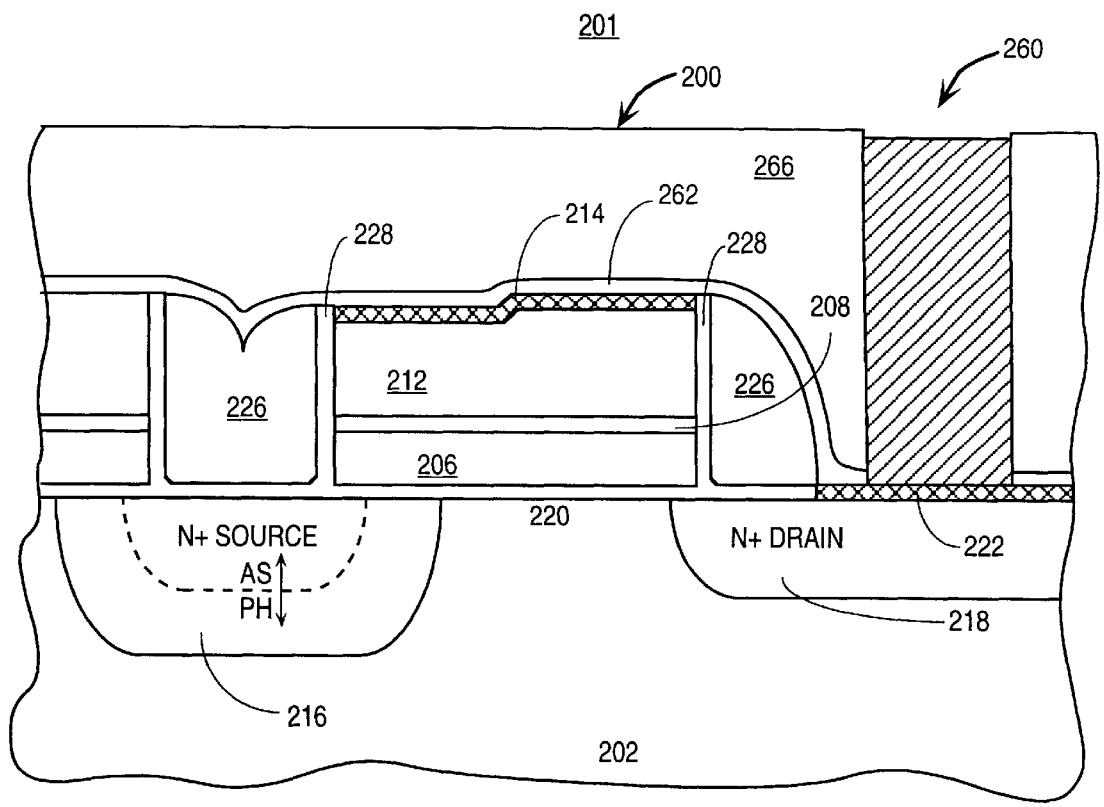
FIG. 2a is an illustration of a cross-sectional view of an electrically erasable nonvolatile memory device in accordance with the present invention.

An example of a nonvolatile memory cell 201 (along the length of the cell) in accordance with the present invention is illustrated in FIG. 2a. The nonvolatile memory cell 201 includes an electrically erasable non-volatile memory 200 formed on a p-type region 202 of a single crystalline silicon substrate (e.g., a boron doped monocrystalline silicon substrate) having doping density between $1-9 \times 10^{17}$ atoms/$cm^3$. A thin, 60 to 120 Å, high quality tunnel dielectric 204, such as a grown silicon dioxide film, is formed on p-type region 202. A high work function floating gate 206 is formed over tunnel dielectric 204 formed over p-type region 202. An interlayer or interpoly dielectric 208 comprising, for example, an oxide/nitride/oxide composite stack having a thickness between 150–250 Å is formed on floating gate 206. A control gate 210 is formed on the interlayer dielectric 208 over floating gate 206. In one embodiment for the present invention control gate 210 is a polycide film (i.e., a film comprising a polysilicon/silicide stack) comprising a lower polysilicon film 212 and an upper silicide film 214 such as but not limited cobalt silicide.

An n+ type source region 216 and n+ type drain region 218 are formed along laterally opposite sidewalls of floating gate 206 and extend beneath floating gate 206 as shown in FIG. 2a. The portion 220 of p-type region 202 between the source and drain regions 216 and 218 beneath the floating gate 206 defines the channel region of 200. Memory 200 is said to be a "n-channel" device because when device 200 is programmed channel region 220 conducts electricity between source region 216 and drain region 218 by inverting portion 220 of p-type region 202 into n-type silicon. Source and drain regions 216 and 218 are heavily doped n-type silicon regions having a doping density of at least $1 \times 10^{19}$ atoms/$cm^3$ and can have a silicide 222, such as cobalt silicide, formed thereon in order to decrease the contact resistance to the device. In an embodiment of the present invention device 200 has asymmetric source and drain regions wherein the source region includes an additional high energy high conductivity implant to form a deeper and graded source region 216.

Device 200 also includes a pair of spacers 224 formed along laterally opposite sidewalls of the floating gate/ dielectric/control gate stack. In an embodiment of the present invention spacers 224 include a bulk silicon nitride portion 226 and a buffer oxide layer 228. Spacers 224 seal and prevent contamination of tunnel oxide 204 and interlayer dielectric 208 and can be used to form silicide layers 214 and 222 by a self-aligned silicide process.

Figure 2B:
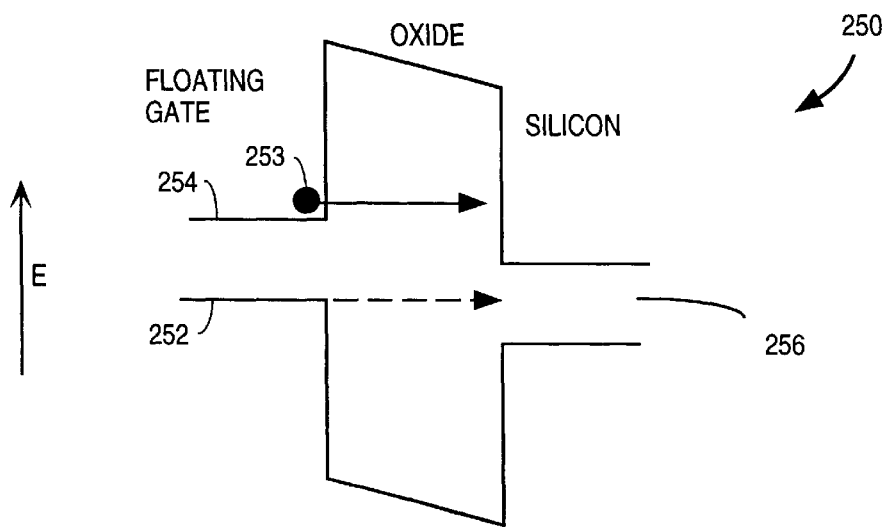
FIG. 2b is an illustration of an energy diagram of a non volatile memory device having a p-type floating gate.
Figure 2C:
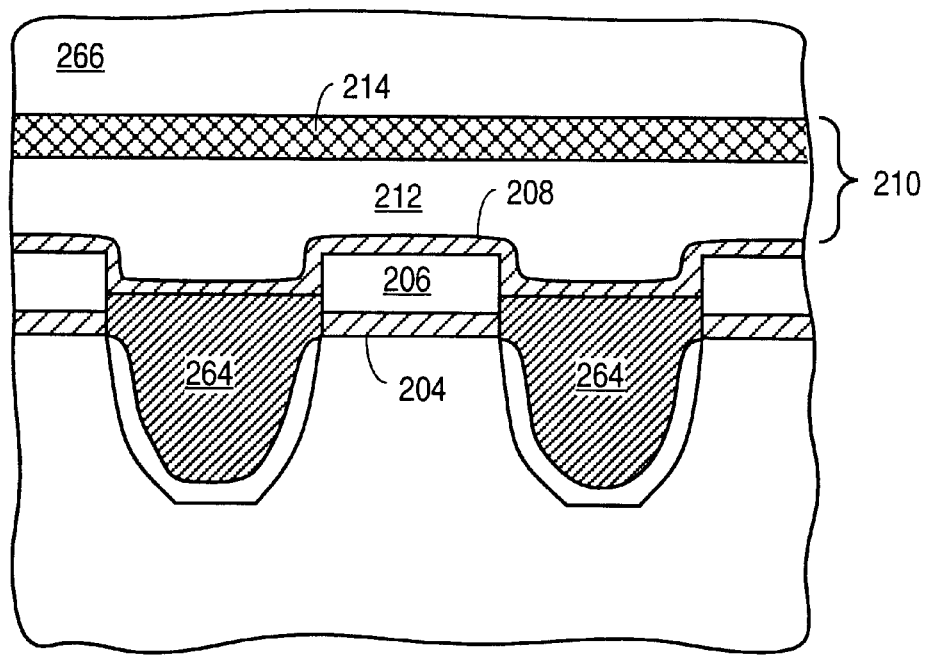
FIG. 2c is an illustration of a cross sectional view of a non volatile memory cell having a self-aligned floating gate.
Figure 2D:
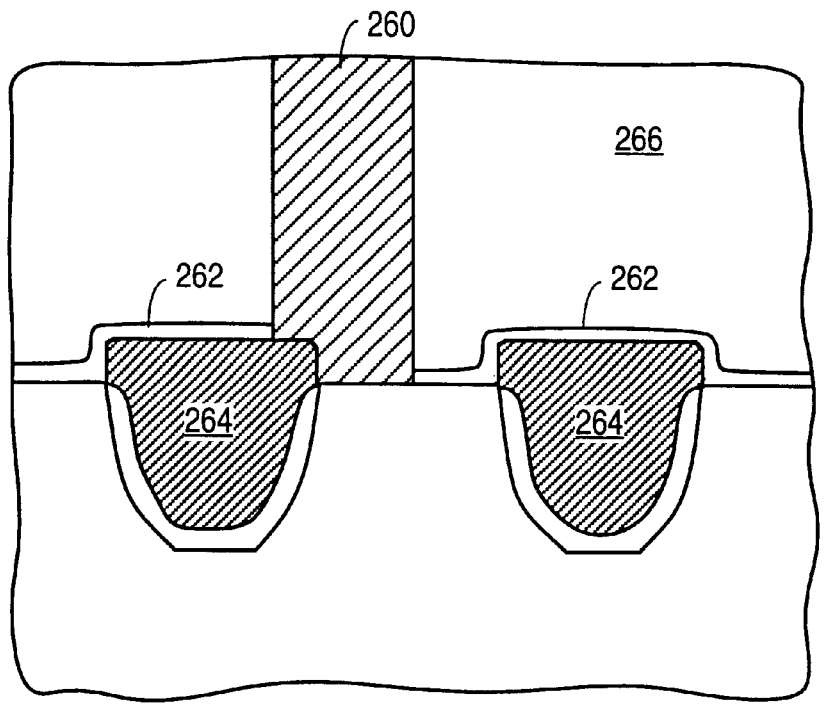
FIG. 2d is an illustration of a cross sectional view of a non volatile memory cell having unlanded contacts.

FIG. 2c and 2d illustrate the cell of the present invention along the width of the cell. FIG. 2c is taken through the floating gate while FIG. 2d is taken through the drain contact. As illustrated in FIG. 2c memory cell 201 includes shallow trench isolation (STI) regions 264 which define there between active areas in which devices 200 are formed. As shown in FIG. 2c device 200 includes a floating gate which has been planarized and self-aligned in the active area between the STI isolation regions. Additionally, as shown in FIGS. 2a and 2d, memory cell 201 includes and etch stop layer 262 formed over the gate stack, contact areas, and STI regions. An interlayer dielectric 266 such as a deposited silicon oxide film is formed over the etch stop layer. The etch stop layer enables the fabrication of unlanded contacts 260 through ILD 266.

A feature which enables a flash cell 201 to be fabricated with a reduced length is the use of a high work function material for the floating gate 206 which dramatically improves the data retention time of the cell. According to an embodiment of the present invention floating gate 206 is formed of a material having an intrinsic work function greater than n-type polysilicon (about 4.1 electron volts). Improving the data retention of the cell enables use of a thin tunnel dielectric, which in turn enables the fabrication of a device with a reduced gate length (source to drain) which in turn reduces the cell length. In an embodiment of the present invention the work function of floating gate material 206 is greater than or equal to 4.6 electron volts and ideally greater than 5.1 electron volts. In an embodiment of the present invention floating gate 206 is formed from p-type polysilicon doped to a concentration level between $5 \times 10^{18}$–$5 \times 10^{19}$ atoms/cm$^3$.

Memory device 200 is erased by removing stored electrons from floating gate 206. Memory device 200 can be erased by placing a relatively high positive voltage (+3.0 volts) onto source region 216 while applying a negative voltage of approximately −11.0 volts onto control gate 210. The use of low source voltage enables scaling of the device. The positive voltage on the source region attracts electrons on floating gate 206 and thereby pulls electrons off floating gate 206 through tunnel oxide 204 and into source region 216. Lack of measurable electrons on floating gate 206 is an indication of an erased memory device 200. In order to program memory device 220, electrons are placed on floating gate 206 by grounding source region 216 while a relatively high positive voltage of +6.0 volts is applied to drain region 218 and while approximately 10–12 volts is applied to control gate 210, in order to invert channel region 220 into n-type silicon so that the channel region 220 turns on and electrons flow between source region 216 and drain 218. The high control gate voltage pulls electrons from the inverted channel regions 220 through tunnel dielectric 204 and onto floating gate 206.

Charge loss is reduced in device 200 because floating gate 206 is made from a material having a high intrinsic work function. A high work function floating gate improves data retention because the barrier height seen by tunneling electrons is higher when the work function is higher. For example, shown in FIG. 2b is an energy diagram 250 for a device having a p-type polysilicon floating gate. As shown in FIG. 2b electrons tunneling from the valence band 252 of a floating gate material have a greater barrier height than that seen by electrons 253 tunneling from the conduction band 254. With p-type poly there are negligible electrons in the conduction band 254. Additionally, electron tunneling from low energy levels in high work function materials can be suppressed by a forbidden transition effect whereby there is no available site in the substrate silicon to tunnel to. For example, as shown in FIG. 2b, electrons in the valence band 252 intercept the band gap 256 of the silicon substrate. Still further a high work function floating gate increases the thermal equilibrium threshold voltage ($V_T$) of a transistor. Charge loss cannot continue beyond a point where thermal equilibrium is reached based on the laws of thermodynamic so charge loss must stop entirely at a more favorable (higher) $V_T$.

Unfortunately, the increase in barrier height seen by the tunneling electrons which is the root cause of improvement in charge loss also inhibits the desirable tunneling that occurs at high field during erase operations. The increased barrier height can cause the erase to become slow. However, increasing the voltage applied to the cell during erase can overcome the increase in barrier height. In the case of p-type polysilicon this can also be overcome by lowering the p-type doping to allow an inversion of the p-type poly into n-type poly during erase operations.

Another feature of the present invention which enables the reduction of cell length is the use of unlanded contacts 260 as shown in FIGS. 2a and 2d. Unlanded contacts 260 are contacts which do not have to be completely positioned over a diffusion regions and can be partially formed over the isolation regions. Unlanded contacts 260 are formed by depositing over the device and isolation regions an etch stop layer 262, which can be selectively etched with respect to the STI 264 and the interlayer dielectric (ILD) 266. The etch stop layer 262 protects the isolation regions during the contact etch. In this way it is acceptable for the contact openings to be misaligned over a portion of the isolation regions. This enables the contacts to be directly aligned to the gate stack, as opposed to the isolation regions, which in turn enables the distance ($d_1$) between the gate and the contacts to be reduced to the minimum space resolution and registration of the process.

Another feature of the present invention which enables a reduction in the cell length is the use of a shared source region between the memory devices and the use of a common source rail to connect the shared source regions together. As shown in FIG. 2a, source region 216 is shared with an adjacent cell. A common source rail connects the shared source regions together thereby allecontactting the need to make separate contacts to each individual shared source region. The use of a source rail to connect the shared source regions enables the gate stacks to be separated by the minimum space resolution and registration enabled by the process.

Figure 3A:
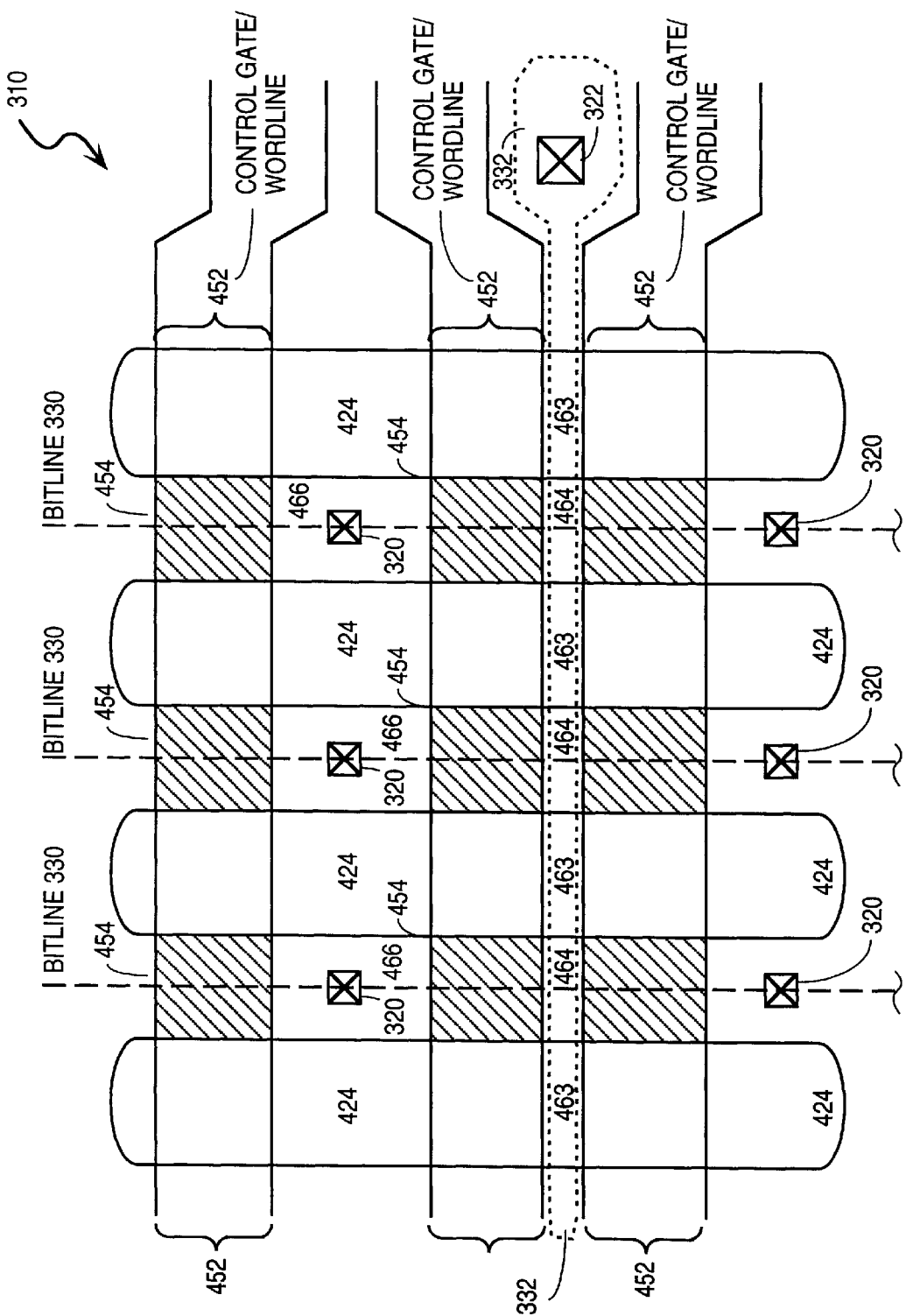
FIG. 3a is an illustration of an overhead view of a portion of a flash memory array.

An example of a source rail is described with respect to FIGS. 3a–3d. An illustration of an overhead view of a portion of a flash memory block 310 of a flash memory integrated circuit in accordance with an embodiment of the present invention is illustrated in FIG. 3a. It is to be appreciated that the layout of FIG. 3a is just one example of many possible different array configuration for memory devices 200. The layout of FIG. 3a is advantageous for at least because it enables a high density placement of memory cells 200. Each block 300 comprises a plurality of flash cells layed out in a plurality of rows and columns. The rows are formed in the wordline direction while the columns are formed in bit line direction. Each flash cell comprises a lower floating gate 454 having a relatively high work function (i.e., higher than n+ polysilicon), and interlayer or interpoly dielectric (not shown), a control gate 452, and a source region 464 and a drain region 466. A common control gate 452, (or wordline) couples all flash cells of a row together while a common bit line, 330, couples all the drains 466 of a column of flash cells together as shown in FIG. 3a. The bit lines are formed in a first level metallization and uses contacts 320 to couple the drains together.

As shown in FIG. 3a, each flash cell shares a source 464 with an adjacent flash cell in the column and shares a drain 466 with the other adjacent cell in the column. Shallow trench isolation regions 424 isolate a column of flash cells from an adjacent column of flash cells as shown in FIG. 3a. A common source rail 332 which runs parallel to the wordline direction couples a row of shared source regions 464 together. The common source rail 332 is formed through the isolation regions by removing the portion 462 of the isolation region 424 between the shared source regions 464 prior to implanting ions for the formation of source regions 464 as shown in FIG. 3c. In this way, the source implant can dope substrate region 463 so that the common source regions 464 in a row are coupled together as shown in FIG. 3d thereby requiring only a single contact 322 to be made for every two rows of flash cells (e.g., second and third rows). Since the source rail 332 is used to couple the shared source regions 464 together, individual contacts are not necessary at the shared source regions enabling minimum spacing to be utilized between adjacent memory cells having a common source thereby decreasing the length of the memory cells.

As is readily apparent the combination of a high work function floating gate, unlanded contacts, and a common source rail enables the fabrication of a memory cell with a greatly reduced cell length.

In an embodiment of the present invention a combination of a self-aligned floating gate, shallow trench isolation, and unlanded contacts are used to reduce cell width. FIG. 2c is an illustration of the memory cell of the present invention taken along the width (wordline direction). As shown in FIG. 2c, the memory cell of the present invention utilizes narrow shallow trench isolation (STI) regions 264. In an embodiment of the present invention the shallow trench isolation regions 264 are filled with silicon dioxide by a sequential deposition/etch/deposition process or by a simultaneous deposition-etch process such as high density plasma (HDP). Such $SiO_2$ deposition processes can fill gaps with narrow openings and large aspect ratios without creating voids therein. Such shallow trench isolation regions greatly reduce the cell width.

Another feature used to reduce the cell width is the fact that the floating gate 206 is self-aligned between trench isolation regions 264 as shown in FIG. 2c. Floating gate 264 said to be self-aligned because no alignment or masking is necessary to pattern a blanket deposited floating gate material into individual floating gates. Self-aligning the floating gate eliminates a critical masking layer in the process. A self-aligned floating gate can be formed by blanket depositing a floating gate material and then chemical mechanical polishing back the material to the top surface of the STI regions. The top surface of the STI regions can then be removed to recess the STI beneath the top surface of the floating gate to enable a large surface area capacitor to be formed between control gate 210 and floating gate 206. Self-aligning the floating gate between shallow trench isolation regions 264 greatly reduces the width necessary to fabricate the memory cell.

Another feature which helps reduce the width of the cell is the use of unlanded contacts as shown in FIGS. 2a, 2c and 2d. As described above the use of unlanded contacts allows the contacts to be misaligned over isolation regions 264. The etch stop layer 262 prevents the STI oxide from being etched out during the contact etch step. In this way, isolation regions can be separated by the minimum distance ($d_3$) enabled by the process resolution and registration thereby enabling a very narrow cell width. As is readily apparent from FIGS. 2a, 2c, and 2d, the combination of a self-aligned floating gate, shallow trench isolation regions, an unlanded contacts enables the fabrication of a memory cell with a very small width.

Method of Fabrication

A method of forming a flash memory integrated circuit in accordance with embodiments of the present invention will now be explained with respect to cross-sectional illustrations shown in FIGS. 4–34.

According to the present invention a silicon substrate is provided in which the flash integrated circuit of the present invention is to be fabricated. In an embodiment of the present invention the substrate 400 includes a monocrystalline silicon substrate 402 having a p-type epitaxial silicon film 404 with a dopant density of between $5\times10^{14}$–$5\times10^{15}$ atoms/$cm^3$ formed thereon. The starting substrate need not, however, be a silicon epitaxial film formed on a monocrystalline silicon substrate and can be other types of substrates. For the purpose of the present invention a substrate is defined as the starting material on which devices of the present invention are fabricated.

Figure 4:
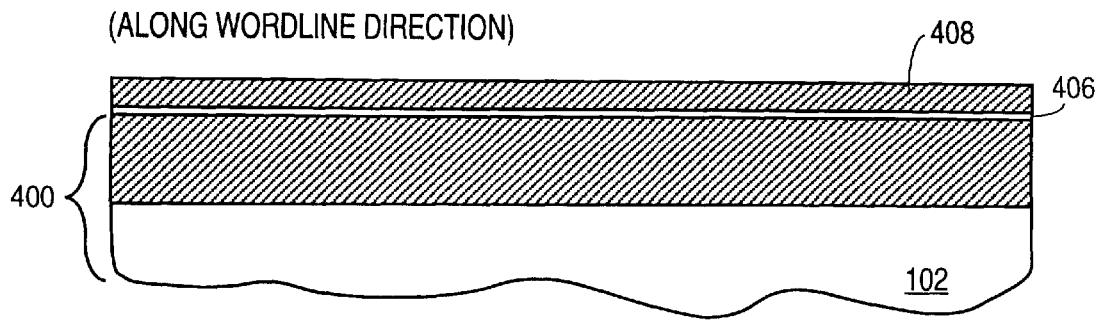
FIG. 4 is an illustration of a cross-sectional view of a substrate taken along the wordline direction showing the formation of a pad oxide and a nitride layer.

According to the present invention first isolation regions are formed in substrate 400. In order to fabricate high density integrated circuits the isolation region are preferably shallow trench isolations (STI) regions. An STI can be fabricated by thermally growing a pad oxide layer 406 onto the surface of substrate 400 and then forming a silicon nitride layer 408 having the thickness between 1500–2500 Å onto the pad oxide layer 406, as shown in FIG. 4.

Figure 5:
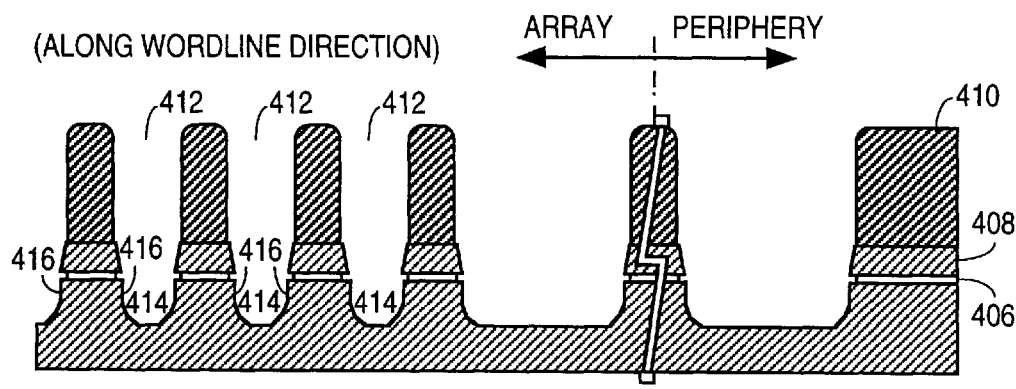
FIG. 5 is an illustration of a cross-sectional view taken along the wordline direction showing the formation of trenches in the substrate of FIG. 4.

Next, as shown in FIG. 5, a photoresist mask 410 is formed using well known masking, exposing, and developing techniques over nitride layer 408 to define locations 412 where isolation regions are desired. Isolation regions will be used to isolate a column of cells from an adjacent column of cells and for isolating the periphery active regions. Next, well known etching techniques are used to remove silicon nitride layer 408 and pad oxide layer 406 from locations 412 where isolation regions are desired. Nitride layer 408 can be plasma etched using a chemistry comprising sulfur hexaflouride ($SF_6$) and helium (He) and pad oxide 406 can be plasma etched with carbon hexaflouride ($C_2F_6$) and helium (He). Next, as shown in FIG. 5 silicon substrate 406 is etched to form trenches 414 where isolation regions are desired. The silicon trench etching step of the present invention forms a trench 414 with tapered sidewall 416. Sidewalls 416 are tapered or sloped to help enable a low source resistance rail to be formed. Sidewalls 416 are formed with a slope of between 60° to 80° from horizontal (i.e., from the silicon substrate surface) and preferably at 65° from horizontal. Tapered sidewalls 416 can be formed by plasma etching with chlorine ($Cl_2$) and helium (He). In an embodiment of the present invention trenches 414 are formed to a depth between 2000 to 4000 Å into silicon substrate 400.

Figure 6:
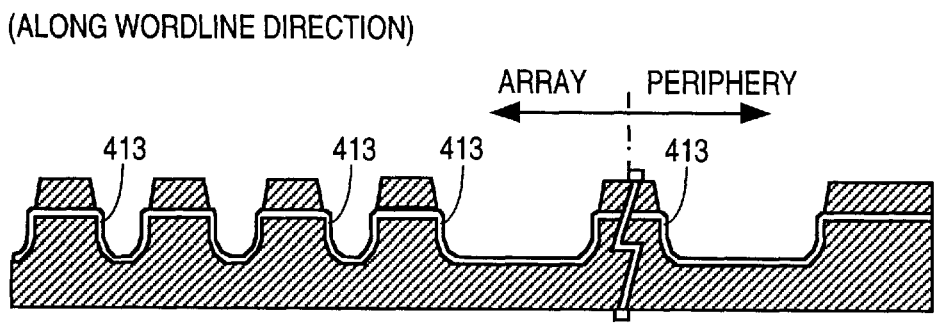
FIG. 6 is an illustration of a cross-sectional view taken along the wordline direction showing the formation of a first trench oxide on the substrate of FIG. 5.

Next, as shown in FIG. 6, photoresist mask 410 is removed and a thin, thermal oxide 413 is grown over the sidewalls of trench 414. Thermal oxide 413 can be grown by heating substrate 400 to a temperature between 900–1000°

Figure 7:
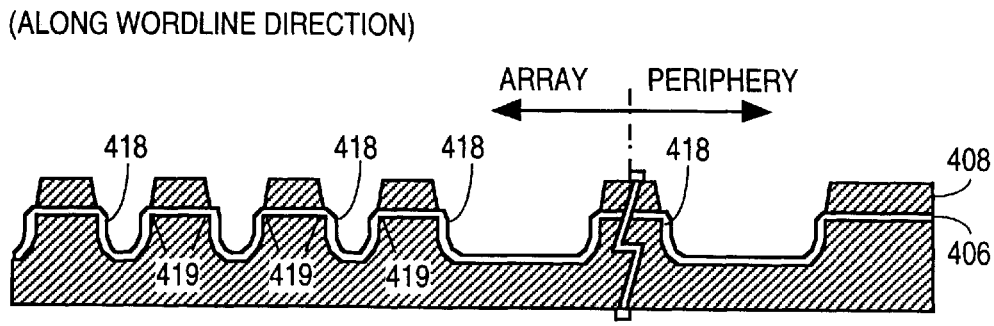
FIG. 7 is an illustration of a cross-sectional view taken along the word line direction showing the formation of a second trench oxide and the rounding of trench corners on the substrate of FIG. 6.

C. while exposing the substrate to an oxidizing ambient such as but not limited to $O_2$. Next, the thermal oxide 413 is etched away using a wet etchant such as hydroflouric acid (HF). Next, as shown in FIG. 7, (along the wordline direction) a second thermal oxide 418 is grown on the silicon sidewalls of trench 414. In an embodiment of the present invention thermal oxide 418 is grown with a two step oxidation process, at first oxidation occurring in a dry ambient, such as $O_2$, followed by a second oxidation occurring in a wet ambient (i.e., in an ambient including water (H2O)). The oxide growth/etch/oxide growth process of the present invention rounds the silicon corners 419 of trench 414. It is to be appreciated that sharp trench corners can cause a weakness in the subsequently formed tunnel oxide at the corners. A weak tunnel oxide at the trench corners can cause cells in a single block to erase differently when tunneling electrons off the floating gate. By rounding the trench corners with the oxide growth/etch/oxide growth process of the present invention corners are rounded and all memory cells in a given memory block can erase at the same rate. Rounded corners 419 of trench 414 enable the reliable integration of shallow trench isolation (STI) regions with flash memory cells. Corner rounding also improves the performance of CMOS devices in the periphery.

In an alternative method for rounding trench corners 419 one can first expose trench 414 to an HF dip to remove a portion of the pad oxide beneath the silicon nitride film and then grow oxide film 413 to round the corners. If desired trench oxide 413 can then be etched away followed by the formation of oxide 418.

Next, as shown in FIG. 8 a trench fill material 420 such as silicon oxide, is blanket deposited by chemical vapor deposition (CVD) over silicon nitride layer 306 and thermal oxide layer 418 in trench 414. In an embodiment of the present invention trench fill material 420 is silicon dioxide formed by a sequential deposition/etch/deposition process or by a simultaneous deposition-etch process, such as high density plasma (HDP). The dielectric fill material 420 is then polished back by chemical mechanical polishing until the top surface 422 of the isolation region is substantially planar with the top surface of silicon nitride layer 408 and all oxide removed from the top of the silicon nitride as shown in FIG. 8. Next, as shown in FIG. 9, silicon nitride layer 408 and pad oxide layer 406 are removed with well known techniques to form a shallow, compact, and planar isolation regions 424.

Figure 10:
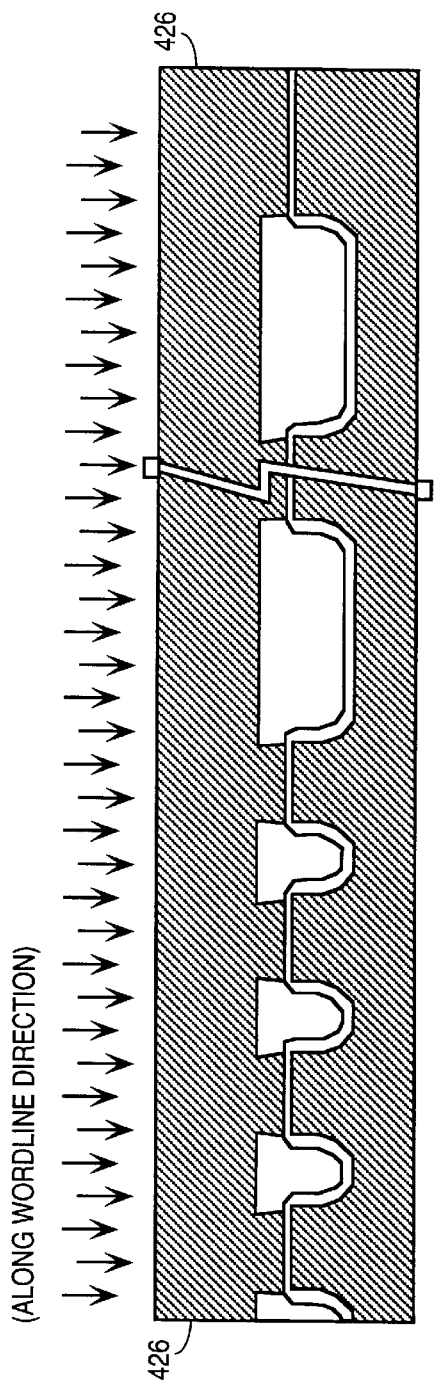
FIG. 10 is an illustration of the cross-sectional view taken along the wordline direction showing the formation of an n-well photoresist mask over the substrate of FIG. 9.

Next, n-type and p-type well implants are made. In one embodiment of the present invention where the peripheral circuitry utilizes CMOS circuitry (i.e. utilizes nMOS and pMOS transistors) and n-type implant is made as shown in FIG. 10. A photoresist mask 426 is formed over the entire array portion of the integrated circuit and over those portions of the periphery which are to be fabricated into n-type devices. N-type dopants, such as phosphorous or arsenic, can be ion implanted at dose between $3-8\times10^{12}$ atom/cm$^2$ and at an energy between 400–800 KeV to form n-type wells in substrate 400 to act as the channel regions for the pMOS devices in the periphery.

Figure 11:
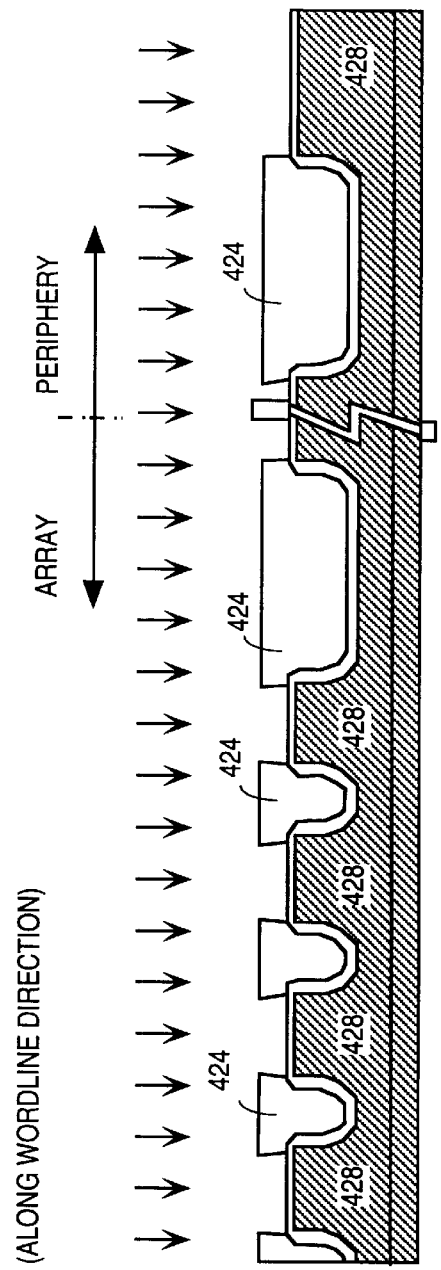
FIG. 11 is an illustration of the cross-sectional view taken along the wordline direction showing the formation of p-wells in the substrate of FIG. 10.

Next, as shown in FIG. 11, photoresist mask 426 is removed with well known techniques, and a second photoresist mask (not shown) is formed over the periphery of substrate 400 to define the locations where p-well implants are to be made. The p-well implant forms p-wells 428 between shallow trench isolation regions 424. The pwell regions extend deeper into substrate 400 then STI regions 424. P-wells 428 can be formed by well known ion implantation techniques utilizing boron ($B^{11}$) at an energy of between 300–500 KeV and a dose of between $(5\times10^{12}-2\times10^{13}$ atoms/cm$^2$). Additionally, the p-well implant can be used to form p-wells in the periphery portion of integrated circuit to form channel regions for the nMOS devices in the peripheral. A p-well photoresist mask can be used to prevent doping of the pmos regions in the periphery.

Next, as shown in FIG. 11, the p-well photoresist mask is removed and substrate 400 heated to drive the n-type and p-type wells to the desired depth. A sacrificial oxide layer 430 is grown over substrate 400 during the drive step. Next, p-type dopants can be implanted into the array portion of the integrated circuit in order to optimize the electrical characteristics of the flash cell.

Figure 12:
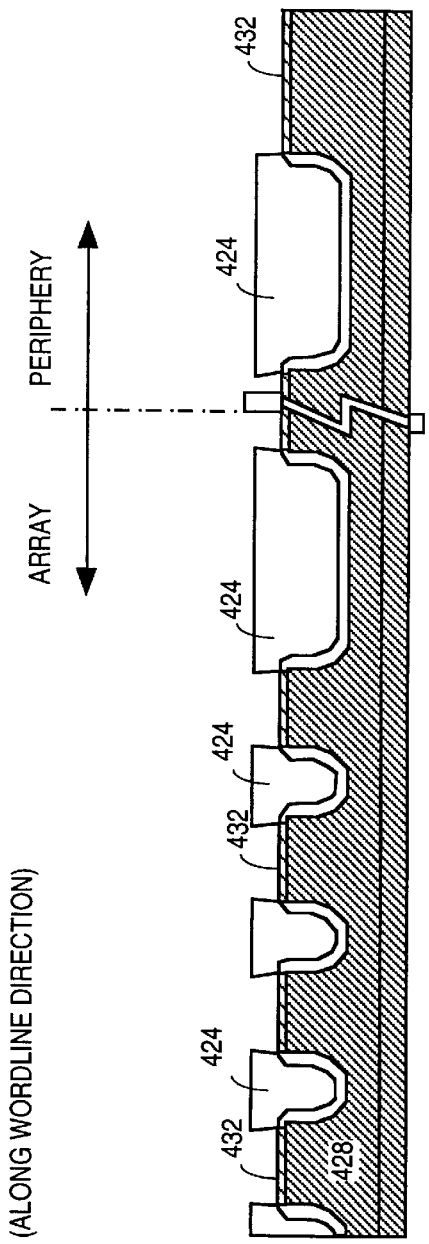
FIG. 12 is an illustration of a cross-sectional view taken along the wordline direction showing the formation of a tunnel oxide on the substrate of FIG. 11.

The sacrificial oxide layer 430 is then stripped off by well known techniques, such as an HF dip, and a high quality tunnel oxide layer 432 having a thickness between 60–120 Å is grown over substrate 400 as shown in FIG. 12. A high quality tunnel oxide can be formed by thermal oxidation of the silicon substrate by exposing silicon substrate 400 to an oxidizing ambient, such as $O_2$ while heating substrate 400 to a temperature of between 750–950° C. in either a furnace or a rapid thermal processor (RTP). In an embodiment of the present invention the tunnel oxide 432 is nitrided by annealing it in an ammonia ambient.

Figure 13:
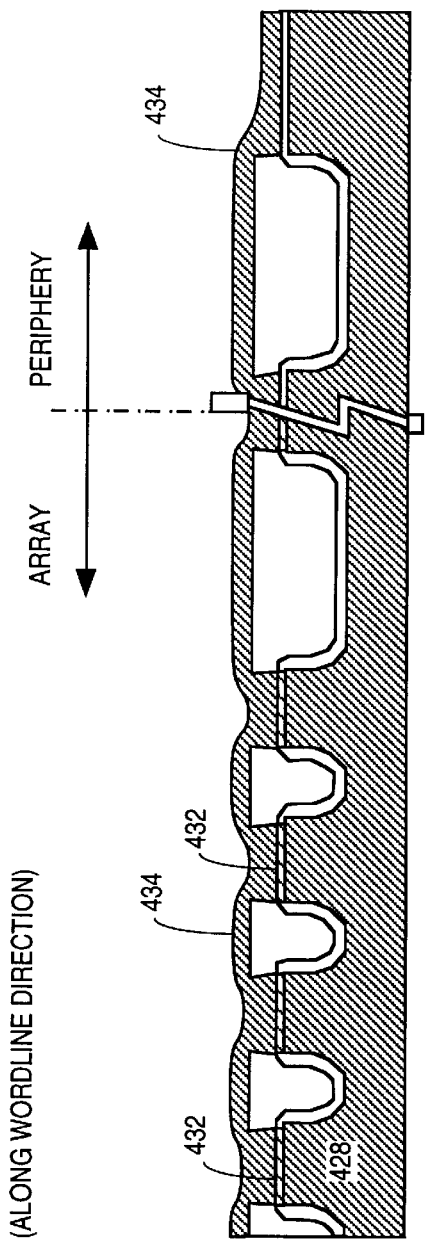
FIG. 13 is an illustration of a cross-sectional view taken along the wordline direction showing the formation of a polysilicon layer on the substrate of FIG. 12.
Figure 16:
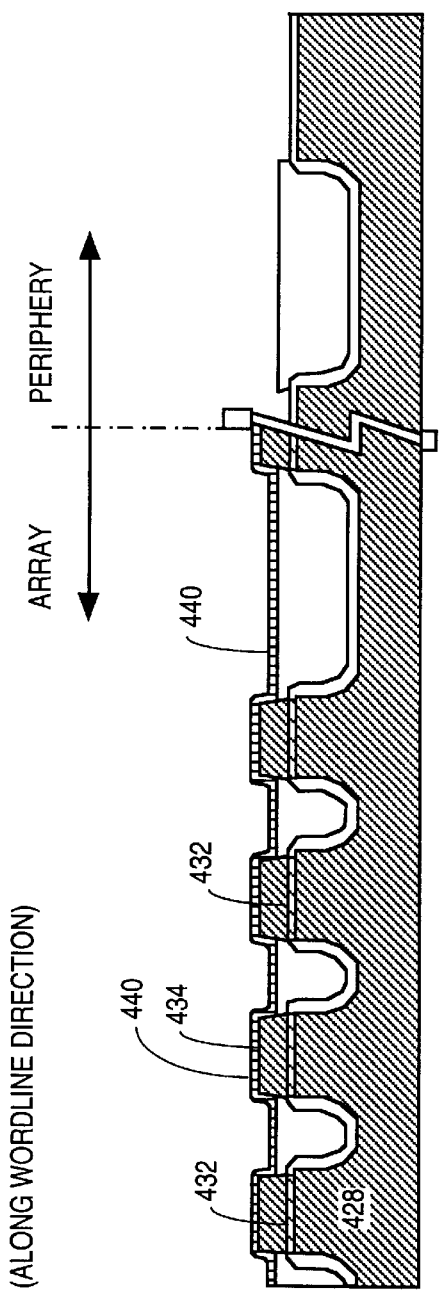
FIG. 16 is an illustration of a cross-sectional view taken along the wordline direction showing the formation of a interpoly dielectric on the substrate of FIG. 15.

Next, a floating gate material 434 is blanket deposited over substrate 400 including isolation regions 424 as shown in FIG. 13. The floating gate material layer is a layer which will be used to form the floating gates with the electrically erasable nonvolatile memory device of present invention. Floating gate material 434 is a film or a composite of films which has a work function greater than the work function of n+ polycrystalline silicon (approximately 4.1 electron volts). In an embodiment of the present invention the work function of the floating gate material 434 is greater than or equal to 4.6 electron volts and ideally greater than or equal to 5.1 electron volts.

In an embodiment of the present invention floating gate material 134 is p-type polycrystalline silicon which is doped to a concentration level between $1\times10^{17}-1\times10^{20}$ atoms/cm$^3$. In one embodiment of the present invention the floating gate material is polysilicon doped to a level between $5\times10^{18}-5\times10^{19}$ atoms/cm$^3$ so that when the fabricated electrically erasable nonvolatile memory device is erased, at least the bottom portion of the p-type polycrystalline silicon floating gate inverse into n-type polysilicon crystalline silicon. A suitable p-type polysilicon film can be formed by depositing a polysilicon film by for example chemical vapor deposition to a thickness between 1000–3000 Å. The polycrystalline film can then be doped with p-type impurities (e.g., boron) during the deposition of the polysilicon film (i.e., insitu doping) or by ion implantation after the polysilicon film has been formed. An undoped polysilicon film can be suitably doped with boron atoms by implanting boron ($B^{11}$) at an energy between 1–30 KeV and a dose of between $1\times10^{12}-3\times10^{15}$ atoms/cm$^2$ to enable the fabrication of a p-type polycrystalline silicon floating gate electrode.

It is to be appreciated that because oxides, such as potentially tunnel dielectric 432, are poor diffusion barriers to boron, care should be taken to anticipate additional doping of the channel region (p-well 428) of the device by subsequent out diffusion of p-type impurities from the p-type polycrystalline floating gate. In an embodiment of the present invention a nitrided oxide tunnel dielectric is used because it helps prevent channel doping by blocking boron diffusion there through.

In an embodiment of the present invention floating gate material 434 is a metal having a work function greater than or equal to 4.6 electron volts and preferably greater than 5.1 electron volts.

Next, as illustrated in FIG. 15, the floating gate material is planarized using a chemical mechanical polishing (CMP) process which completely removes the floating gate material from the isolation regions. The CMP processing step allows the floating gate to be self-aligned with the active region edges of the memory cell thus overcoming the need to compensate for this with alignment. The polishing of floating gate material 434 defines a plurality of parallel lines 438 that run into and out of the page of FIG. 15. (i.e. lines 438 extend in the bit line direction). Since the polysilicon floating gate lines 438, are defined by the width of the space between the isolation regions, they can be made narrower than allowed by photolithography thereby achieving a smaller cell width. It is to be appreciated that in the present invention the patterning of the floating gate material of the memory cell is achieved without a specific use lithography step thus providing a cost effective self-aligned floating gate.

It should be noted that the thickness of the floating gate lines 438 are set by the thickness that the oxide layer of the isolation region extends above the substrate and the amount of the over polish performed at the floating gate polish. The thickness that the oxide layer extends above the substrate in the isolation region is set by the thickness of the nitride layer (and the pad oxide layer) used for defining the active and isolation regions and the amount of over polish performed at the STI polished step. Thus, the thickness of the floating gate lines 438 can be controlled by the thickness of the nitride layer (and pad oxide layer) used for defining the active isolation regions and by the amount of over polishing after the two steps. It should be further noted that the thickness of the floating gate is determined by the thickness of the nitride layers thick nitride layer will result in a thicker floating gate and a thinner nitride layer will result in a thinner floating gate.

Additionally, as illustrated in FIG. 15, in a preferred embodiment of the present invention, a small portion of the top of the oxide in the STI is recessed to expose the sidewalls of the planarized floating gate material. This process exposes the sides of the floating gates which increases the exposed surface area of the floating gate. Increasing the surface area of the floating gate improves the capacitive coupling with a subsequently formed control gate. Any well known oxide etchant which is selective to the floating gate material can be used to recess the isolation region.

The floating gate material in the periphery portion of the circuit can now be removed by masking the array portion and dry etching the floating gate materials from the periphery.

An interlayer or interpoly dielectric 440 is then blanket formed over and around the patterned floating gate lines 438 and over trench isolation regions 424. In an embodiment of the present invention interpoly dielectric is a composite oxide comprising a lower thermally grown or deposited oxide film, a middle deposited silicon nitride film and a top deposited oxide film. Such an the interlayer dielectric is sometimes referred to as a ONO dielectric. It is to be appreciated however, that other well known interlayer dielectrics may be utilized. In an embodiment of the present invention the ONO stack has a thickness between 150–250 Å. At this time, if desired, boron ions can be implanted into the periphery portion of the integrated circuit in order to adjust the threshold voltage of the nMOS devices, and arsenic and phosphorus can be implanted into pMOS devices to adjust their threshold voltages.

Figure 17:
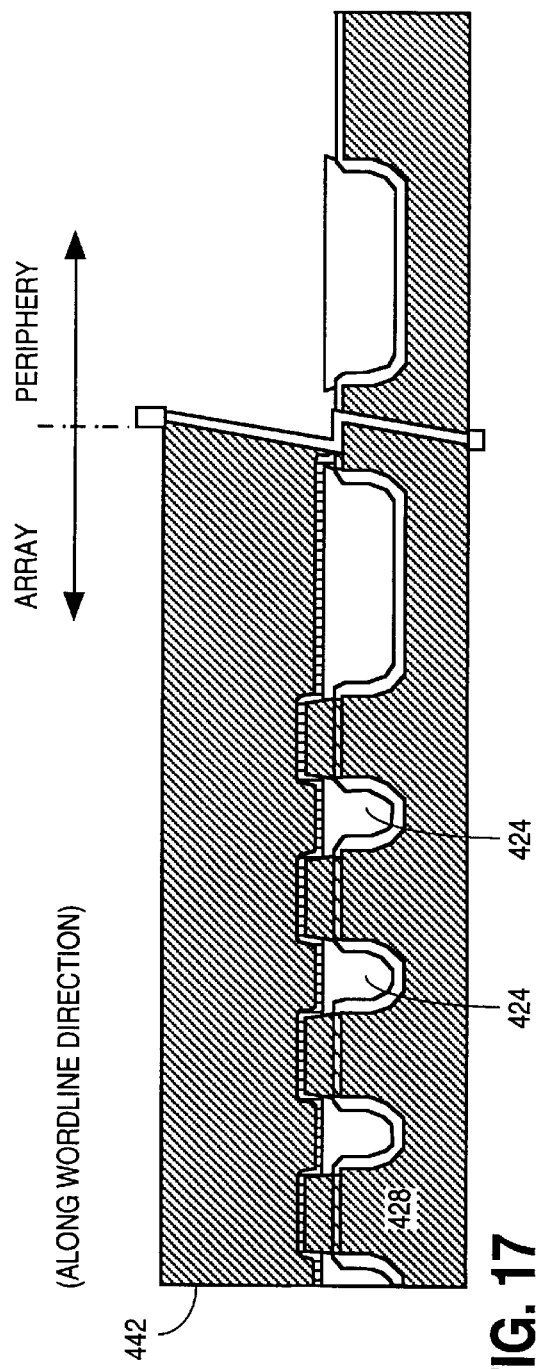
FIG. 17 is an illustration of a cross-sectional view taken along the wordline direction showing the removal of the interpoly dielectric from the periphery portion of the integrated circuit.

Next, as shown in FIG. 17, a photoresist mask 442 is formed over substrate 400 and covers the array portion of the integrated circuit and exposes the periphery portion of the integrated circuit. Next, as shown in FIG. 17, the interlayer dielectric 440 is removed from the peripherial portion of the integrated. Next, as shown in FIG. 18, a gate dielectric layer 444 is grown on the silicon substrate 100 in the periphery of integrated circuit. Next, as shown in FIG. 19, a polysilicon layer 446 is blanket deposited over substrate 400. The polysilicon layer 446 is formed over the interlayer dielectric 440, over floating gate lines 438, and over interlayer dielectric 440 over the shallow trench isolation regions 424 in the array portion of integrated circuit and is formed over the gate oxide layer 444 in the peripherial portion of integrated circuit. In an embodiment of the present invention polysilicon layer 446 is deposited to a thickness between 3000–5000 Å. Polysilicon film 446 can be formed by any well known techniques such as by chemical vapor deposition and can be insitu doped or subsequently doped by ion implantation if desired. In an embodiment of the present invention polysilicon film 446 remains undoped at this time and is subsequently doped by the cell and CMOS source/drain implant.

Next, as shown in FIG. 20, a polysilicon layer 446 is planarized by chemical mechanical polishing in order to form a planar top surface 448. In an embodiment of the present invention polysilicon layer 446 is polished until approximately between 2000–2500 Å of polysilicon remains above interlayer dielectric 440. The planar surface 448 of polysilicon layer 446 enables improved lithography for the subsequent patterning or delineation of polysilicon layer 446. Polishing of polysilicon layer 446 is crucial for enabling good critical dimension (CD) control during subsequent patterning of polysilicon layer 446. Polishing of polysilicon layer 446 helps enable high density fabrication of flash cells.

Next, as shown in FIGS. 21a and 21b, a photoresist mask 450 is formed over substrate 400 and the exposed portions of polysilicon film 446, interlayer dielectric 440, and floating gate lines 438 are anisotropically etched in alignment with photoresist mask 450 in order to form a plurality of flash cells and control lines. FIG. 21a is a cross-sectional view of substrate 400 taken along the word line direction while FIGS. 21b is a cross-sectional view taken along the bit line direction (FIG. 21a is perpendicular to the cross-section of FIG. 21b). As shown in FIGS. 21a and 21b, the masking and etching processes patterns second polysilicon layer 446 into a plurality of control gate lines 452, as shown in FIG. 21b. Each of the control gate lines 452 extend in the word line direction and passes over each of the poly floating gates along a row in a word line direction as shown in FIG. 21a. Additionally, as shown in FIG. 21b the masking and etching process also removes the exposed portion of floating gate lines 438 in order to define a plurality of discrete floating gates 454. That is, the masking and etching steps remove the portion of polysilicon lines 438 which are not covered by control gate lines 452 as shown in FIG. 21b. Additionally, as shown in FIG. 21b, the masking and etching steps form a plurality of floating gate 454/dielectric 440/poly 452/stacks 456. As shown in FIG. 21b, a cell stack in the column are separated on one side from the adjacent cell by the minimum spacing 458 which can achieved by the photolithography/etching technique used. For example, if the photolithography/etching technique can form lines having a 0.18 micron dimension then the cells which have a shared source will be separated by the minimum 0.18 micron dimension. Additionally, adjacent stacks which share a common drain are separated by dimension 459 which are large enough to form a metal contact to the common drain regions. Polysilicon layer 446, can be anisotropically etched utilizing a plasma etch comprising the chemistry of HBr, chlorine (Cl2) and helium (He) and ONO dielectric 140 can be plasma etched using $C_2F_6$ and $O_2$. If floating gate material 434 is p-type polysilicon then it can be etched in the same manner as polysilicon layer 446, if floating gate material 434 is a metal than any suitable anisotropic etching technique for the metal such as plasma etching or reactive ion etching may be used.

Figure 22B:
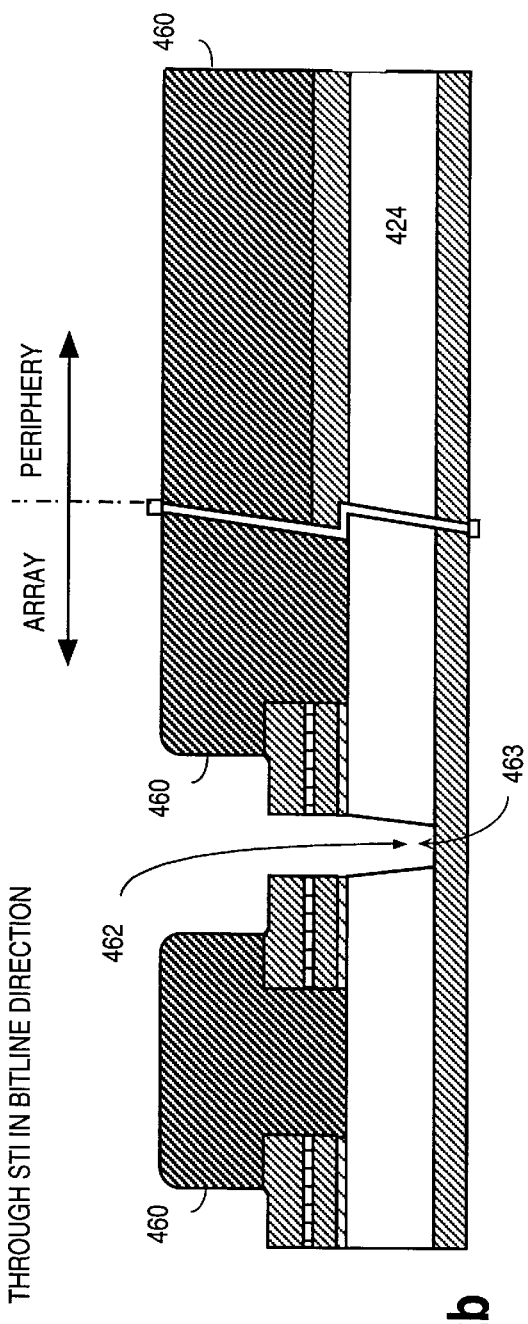
FIG. 22b is an illustration of a cross-sectional view taken through the shallow trench isolation regions in the bitline direction showing the portion of the shallow trench isolation which is to be removed to generate the source rail.

Next, as shown in FIGS. 22a and 22b, a mask 460 is formed over substrate 400. FIG. 22a is a cross-sectional view through the cell source/drain region taken along the bit line direction while FIG. 22b is a cross-sectional view through a STI region (424) taken along the bit line direction. Mask 460 defines location where a source rail will be formed which connects a row of shared source regions. Mask 460 exposes portion 458 of substrate 400 between each of the flash cell pairs where the common source is to be formed. The mask also exposes the portion 462 of shallow trench isolation region located between the common source regions making up a row of common source regions see also FIG. 3b. Next, as also, shown in FIGS. 22a and FIG. 22b substrate 400 is exposed to an oxide etchant which is highly selective to silicon (i.e., exposed to an etchant which etches oxide but not silicon). An etchant having an at least 20:1 selectivity between oxide and silicon is preferred. The oxide etchant removes the portion of shallow trench isolation regions exposed by mask 460. The exposed shallow isolation region is etched until all of the exposed oxide is removed to expose the underlying portion of p-type epitaxial substrate (see also FIG. 3c). Removing portions 462 of STI regions 424 forms a continuous row of silicon which will eventually form a continuous source rail for electrically coupling a row of shared source regions see also FIG. 2c.

Figure 23:
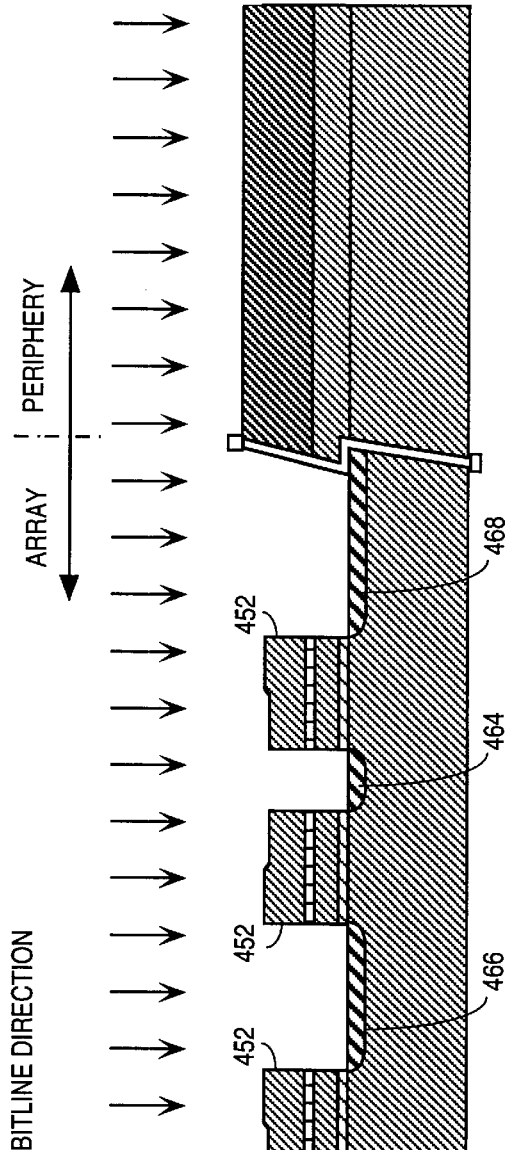

Next, as shown in FIG. 23 (along the bit line direction) n-type source/drain implants are made into the array. According to the present invention n-type dopants are implanted into substrate 400 on opposite sides of stacks 456. In an embodiment of the present invention arsenic ($As^{75}$) ions are blanket implanted into the array portion of substrate 400 at a dose of between 1.0 to $3.0 \times 10^{15}$ atom/cm$^2$ at an energy of between 10–20 KeV while the periphery is masked. The n-type source/drain implant use a 90° implant angle (i.e., ions are implanted perpendicular to the surface of substrate 400) as shown in FIG. 23. The ion implantation step forms the shared source regions 464 and forms a shared drain region 466 between flash cells. In this way each flash cell shares a drain with an adjacent flash cell in the column and shares a source with the other adjacent flash cell in the column. Additionally, the source/drain implant also places dopants into substrate portion 463 were STI portion 462 was removed. (FIG. 3d) Because the source/drain ion implant step in the array is not masked the control gate 452 acts as the mask preventing the n-type dopants from doping the channel region of the flash cells. The source/drain implant step also dopes the second polysilicon layer in the array allecontactting the need for a separate doping step to dope the floating gate layer. The relatively low energy source/drain implant forms shallow and abrupt source/drain regions.

Next, as shown in FIG. 24, (along the bit line direction) a mask 468 similar to mask 460 is formed over substrate 400. Mask 468 exposes the common source regions 464 and the doped silicon regions 463 between the common source region 464 where portion 462 of STI regions 424 were removed. Next, as shown in FIG. 22 second ion implantation of n-type dopens can be formed into the common source regions and into the doped silicon substrate regions 463 in order to increase the conductivity type of a source region and to increase the conductivity of the source rail to thereby reduce the resistivity of the rail and improve performance. The additional source implant can be carried out utilizing a first doping of phospherous atoms ($P^{31}$) at an energy between 10–20 KeV and at a dose of between $1–10^{14}$ atoms/cm$^2$ followed by a second doping with arsenic atoms ($As^{75}$) at a dose between $2–5 \times 10^{15}$ atoms/cm$^2$ at an energy between 16–20 KeV. Like the source/drain implant the source implant implants ions perpendicular (90°) to the surface of the substrate. The source/drain implant and the source implant create a low resistance shared source regions 464 and a low resistance source rail in the substrate portion 463 connecting the shared source/drain regions 464. By utilizing the additional source doping techniques shown in FIG. 22, asymmetrical source and drain doping profiles are achieved for the flash cells. The drain regions have a relatively shallow and uniform doping profile, while the sources 464 have a relatively deep and graded profile. Additionally, shared source regions 464 are doped to a higher concentration in order to help reduce the source rail resistance. The ion implantation steps create a source rail having a resistance of between 400–300 ohms/cell.

Referring to FIGS. 3a–3d, the low resistance source rail fabrication aspect of the present invention is further described. FIG. 3a is an over head view of the array portion of integrated circuit. FIG. 3b is a cross-sectional view of FIG. 3b taken in the wordline direction through the shared source regions after formation of mask 160 (in FIG. 20) and prior to the etching of STI portion 462. As is readily apparent in FIG. 3b the masking step shown in FIG. 22 exposes the silicon substrate 458 where the shared source drain regions are to be formed and exposes the STI portion 462 located between silicon substrate 458. Next, as shown in FIG. 3d, the highly selective oxide etch of FIG. 22 removes those portions 462 of the STI regions between regions 458 in a row of the array to reveal substrate portions 463 beneath the removed portions 462. Next, as shown in FIG. 3d, during the source/drain doping described with respect to FIG. 23 and the source doping shown in FIG. 24, substrate area 458 is doped to form common source region 464. Additionally, the doping of FIGS. 23 and 24 also doped the silicon portion 463 between shared source regions 464 shown in FIG. 3d. Thus, each shared source region in a row is coupled by a doped substrate region 463 to the adjacent shared source region 464 as to form a source rail 332 for a row of cells. A single contact point 222 (which is eventually silicided) is used to electrically connect the source rail 332 to circuitry of the integrated circuit. Because sidewalls 416 of STI 424 where adequately sloped during the formation of trench 414, 90° angled implantation steps can be used to adequately dope the sidewalls of silicon region 463 without the use of an elaborate doping technique such as large angled implant. The source rail 332 is heavily doped silicon having an n-type doping density of at least $5 \times 10^{19}$ atoms/per cm$^3$. The minimum depth of the source rail 332 which occurs at the sidewalls 416 is at least 0.1 microns thereby enabling a low resistance source rail 200 to be formed.

Next, the second polysilicon layer in the peripherial portion of integrated circuit can now be masked exposed and etched to pattern the second polysilicon layer into gates in the peripherial portion of the integrated circuit. This step can be formed prior to forming cell gates and cell source/drain regions. Next, as shown in FIG. 25, (along the bit line direction), a thin thermal oxide 470 is grown over the top and over the sidewalls of the flash cells and over the exposed portions of a silicon substrate 400 (e.g., source/drain regions 464 and 466 and source rail portions 463). The thermal oxide passivates the sidewalls of the flash cells as well as thickens the oxide near the gate edges. Next, a thin high temperature oxide 472 (HTO) is blanket deposit by CVD over the thermal oxide 470 as shown in FIG. 25. The high temperature oxide acts as an etch stop for a subsequent silicon nitride spacer etch step.

At this time one can form n-type tip regions in the periphery portion of the substrate to form n-type tip regions for the nMOS devices in the periphery. Additionally, at this time p-type tip implants for the periphery portion of the circuit can be made. During the p-type and n-type tip implants of the periphery portion of the circuit a mask covers the array portion of the substrate so that no doping of the array portion occurs.

Figure 26:
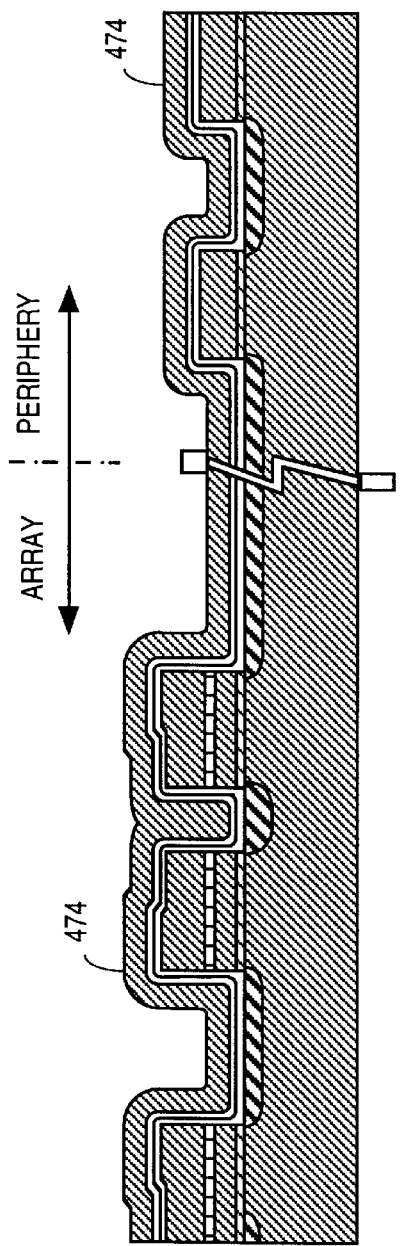
FIG. 26 is an illustration of a cross-sectional view taken along the bitline direction showing the formation of a silicon nitride layer over the substrate of FIG. 25.

Next, a silicon nitride film 474 is blanket deposited over substrate 400 as shown in FIG. 26 (taken along the bit line direction). Silicon nitride film 474 will be used to form spacers. The deposition thickness of the silicon nitride film 474 dictates the width of the subsequently formed spacers. Silicon nitride layer 474 is formed to a thickness at least half the distance 473 (see FIG. 23) between flash cells having a shared source 464 so that the narrow source space 473 between cells having shared source is completely filled with silicon nitride 474 as shown in FIG. 24. In, an embodiment of the present invention silicon nitride film 474 is deposited to a thickness of between 1200–2500 Å. In a case when the narrow source space 473 between the flash cell having a shared source is approximately 0.25 microns, silicon nitride film 474 is formed to a thickness of approximate 1250 Å. Any well known technique which can be used to deposit a comformal silicon nitride layer, such as chemical vapor deposition utilizing source gases comprising ammonia $NH_3$ and silane $SiH_4$ can be used to deposit silicon nitride film 474.

Figure 27:
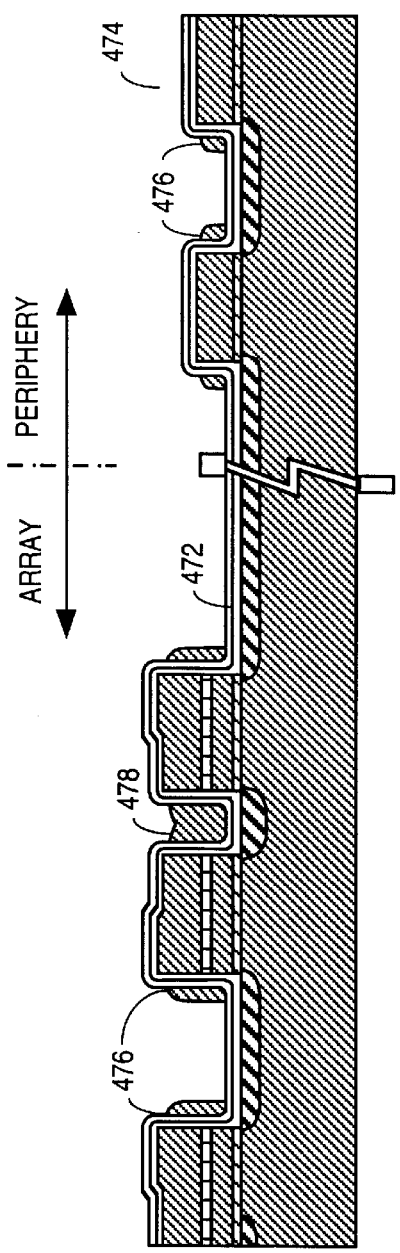
FIG. 27 is an illustration of a cross-sectional view taken along the bitline direction showing the formation of spacers from the silicon nitride layer on the substrate of FIG. 26.

Next, as shown in FIG. 27 (along the bit line direction) silicon nitride film 474 is anisotropically etched to form a plurality of spacers 476 which run along sidewalls of each flash stack. Additionally, the anisotropic etch leaves a silicon nitride stud 478 in the narrow source gap between the cells sharing a source region. Silicon nitride stud 478 prevents contaminants from subsequent processing steps from adversely effecting the reliability and quality of the tunnel oxide and interpoly dielectric. Deposited oxide layer 472 acts as an etch stop for the anisotropic silicon nitride etch step. Any anisotropic etching technique which preferentially etches silicon nitride as compared to silicon dioxide can be used, such as plasma etching utilizing the chemistry comprising sulfur hexaflouride ($SF_6$) and helium (He). The silicon nitride etch step also forms spacers 476 which run along laterally opposite sidewalls of patterned polysilicon layer 446 in the peripheral portion of the integrated circuit.

Figure 28:
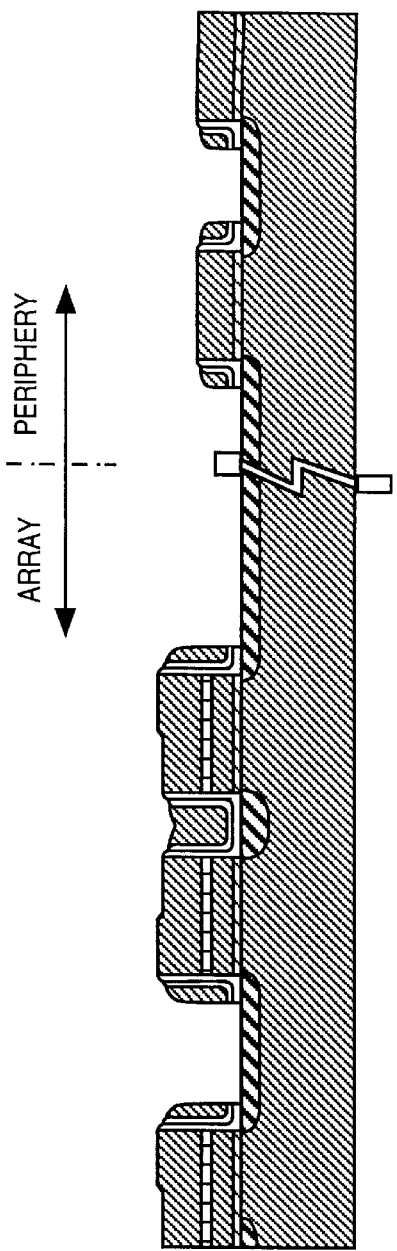
FIG. 28 is an illustration of a cross-sectional view showing the removal of the oxide layer from the substrate of FIG. 27.

Next, as shown in FIG. 28 (along the bit line direction) an etch step is used to remove the oxide films 472 and 470 from the active regions not protected by the nitride spacers as well as from the top of the second polysilicon layer. A plasma etch using a chemistry comprising carbon hexaflouride ($C_2F_6$) and helium can be used to remove oxide films 472 and 470. Next, at this time an n+source/drain implant mask can be formed which covers the entire array portion of integrated circuit and covers the pMOS portion of the periphery of the integrated circuit and then heavy n+source/drain implants made for the nMOS devices. Similarly at this time a p+source/drain implant mask can be formed over the array portion of integrated circuit and over those portion of the periphery used to form nMOS devices and then heavy p+source/drain implants made into the peripherial circuit.

During the n+source/drain implant and p+source/drain implant made into the peripherial circuit, the array portion is masked in order to prevent the relatively deep implants made into the periphery from affecting the relatively shallow drain 466 and the graded source 464 formed in the array portion of integrated circuit.

Figure 29:
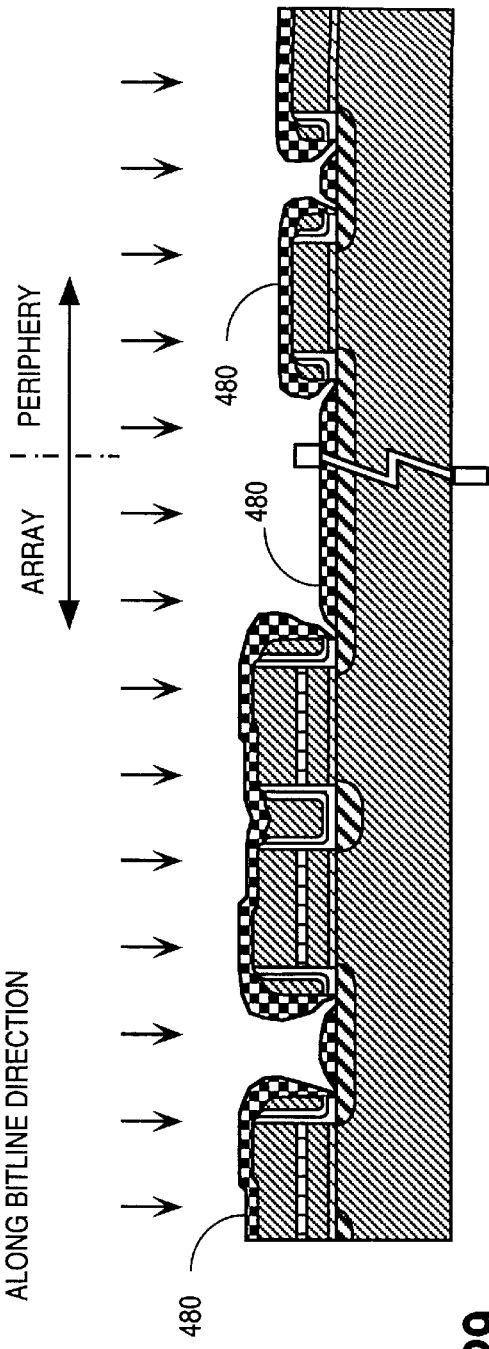
FIG. 29 is an illustration of a cross-sectional view taken along the bitline direction showing the formation of a metal layer of the substrate FIG. 28.

Next, as shown in FIG. 29, (along the bit line direction), a refractory metal film 480 is blanket deposited over substrate 400. Any refractory metal film which can react with silicon to form a low resistance metal silicide when heated to a suitable temperature may be utilized. Prior to metal film deposition a short HF dip can be used to remove any native oxides. In a preferred embodiment of the present invention the metal film 480 is cobalt deposited to a thickness between 200–500 Å. Other refractory metals which can form silicides such as titanium and tungsten can be used if desired. Any well known technique such as but not limited to sputtering, can be used to blanket deposit metal film 480. If desired, silicon atoms ($Si^{28}$) can be implanted into metal film 480 at a dose of between $2-4 \times 10^5$ atoms/cm$^2$ and at an energy between 20–30 KeV.

Figure 30:
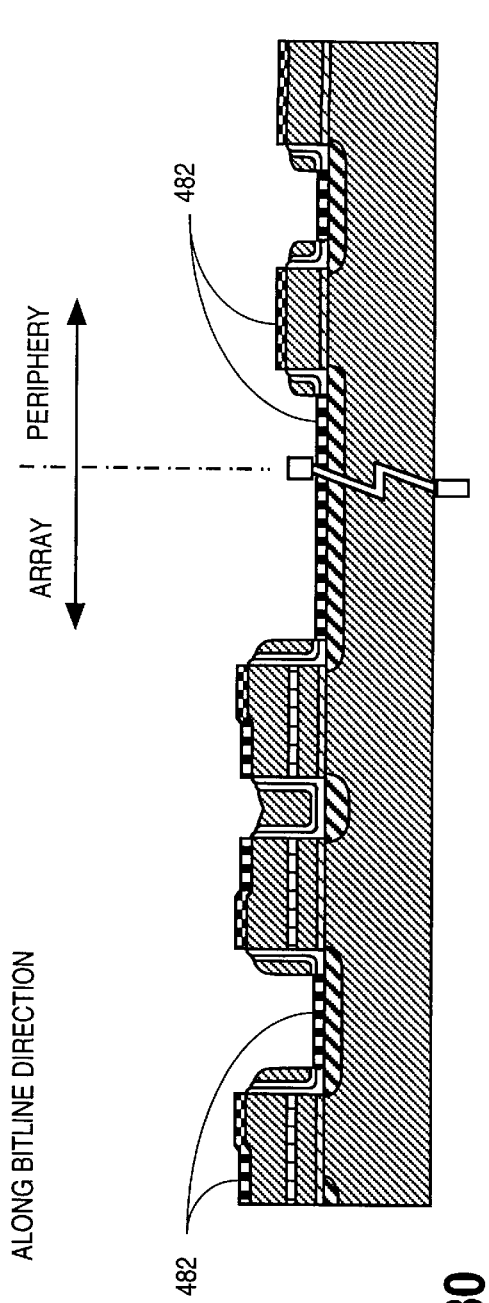
FIG. 30 is an illustration of a cross-sectional view taken along the bitline direction showing the formation of a silicide from the substrate of FIG. 29.

Next, as shown in FIG. 30, (along the bit line direction) substrate 400 is heated to a temperature sufficient to cause metal film 480 to react with silicon to form a metal silicide. Metal silicide forms on those locations where silicon is available for reaction with the metal and is indirect contact with the metal. As such, metal silicide 482 forms on the top of polysilicon control gates, on the drain regions 466, and on the source rail contact regions (not shown) as well as on the source/drain regions and on the gate of MOS devices in the periphery of integrated circuit and polysilicon interconnects. Metal film 480 remains unreacted over areas where there is no silicon available for reaction such as dielectric layers, including sidewall spacers 476, silicon nitride plug 478, and shallow trench isolation regions 424. Any suitable heating or annealing process can be used to form metal silicide 482 including a furnace anneal or a rapid thermal anneal.

Figure 31:
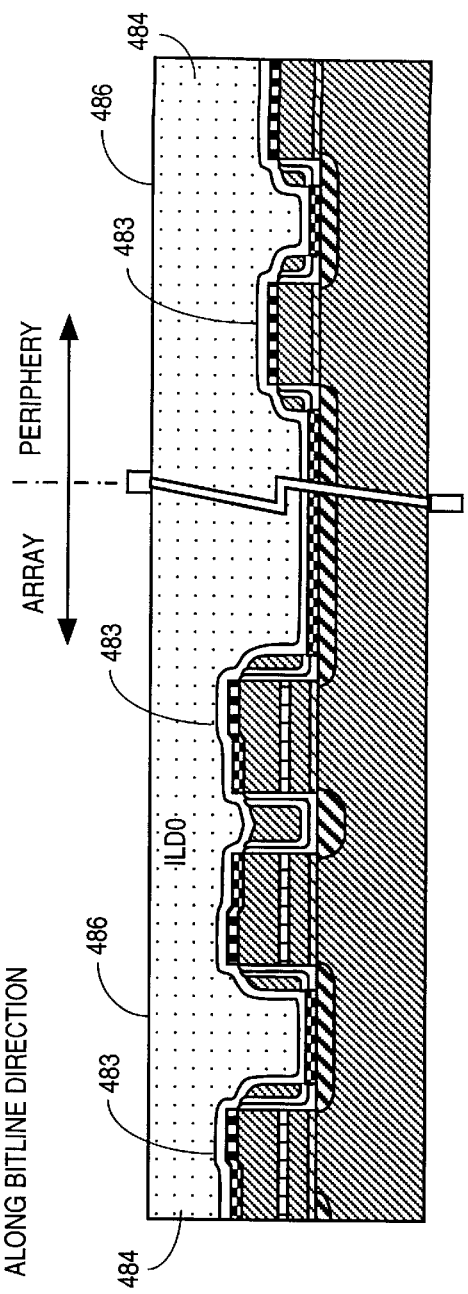
FIG. 31 is an illustration of a cross-sectional view taken along the bitline direction showing the formation of an etch stop layer and a planar interlayer dielectric over the substrate of FIG. 30.

Next, as also shown in FIG. 31, unreacted metal is etched away with an etchant which selectively removes the unreactive metal but does not remove the formed metal silicide 482. Any suitable wet etchant can be utilized to selectively remove the metal without etching the silicide. Such a self aligned process to form a silicide is known as a salicide process.

Next, as illustrated in FIG. 31, (along the bit line direction), an etch stop layer 483 is blanket deposited over the substrate including polysilicon gate stacks, the silicide diffusion regions 466 and the shallow trench isolation (STI) regions 424. Etch stop layer 483 is formed of a material which can be selectively etched (>20:1) with respect to STI regions 424 and to a subsequently deposited interlayer dielectric. If STI regions 424 and the ILD are formed from SiO2 than a suitable etch stop layer is silicon nitride formed to a thickness of between 100–500 Å. Next, an interlayer dielectric 484 is blanket deposited over substrate 400. Interlayer dielectric 484 can be any suitable dielectric such as silicon dioxide and can be a composite dielectric comprising a plurality of different deposited dielectrics. In a preferred embodiment interlayer dielectric 484 is silicon dioxide formed by a sequential deposition/etch/deposition process or by a simultanious deposition-etch process, such as a density plasma (HDP) process, in order to fill high aspect ratio openings without creating voids therein. Next, as also shown in FIG. 31, interlayer dielectric 484 is planarized by chemical mechanical polishing to form a planar top surface 486. ILD layer 484 should be deposited to a thickness sufficient to enable a sufficient amount of dielectric to be removed so that a sufficiently planar top surface 484 can be achieved while still leaving a sufficient amount of dielectric, for example between 3500–4500 Å of interdielectric, above the highest features (e.g., silicon flash cells) to sufficiently isolate the features from a subsequently formed metal line on planar surface 486.

Next, contacts are formed through interlayer dielectric 484 and etch stop layer 483. In the present invention electrical contact are formed to each of the shared drain regions, to each of the control gates, and to each source rail contact area, as well as to source/drain regions and gates of the pMOS and NMOS devices in the peripherial portion of the integrated circuit. In the present invention all contacts are made to low resistance silicide regions.

Figure 32:
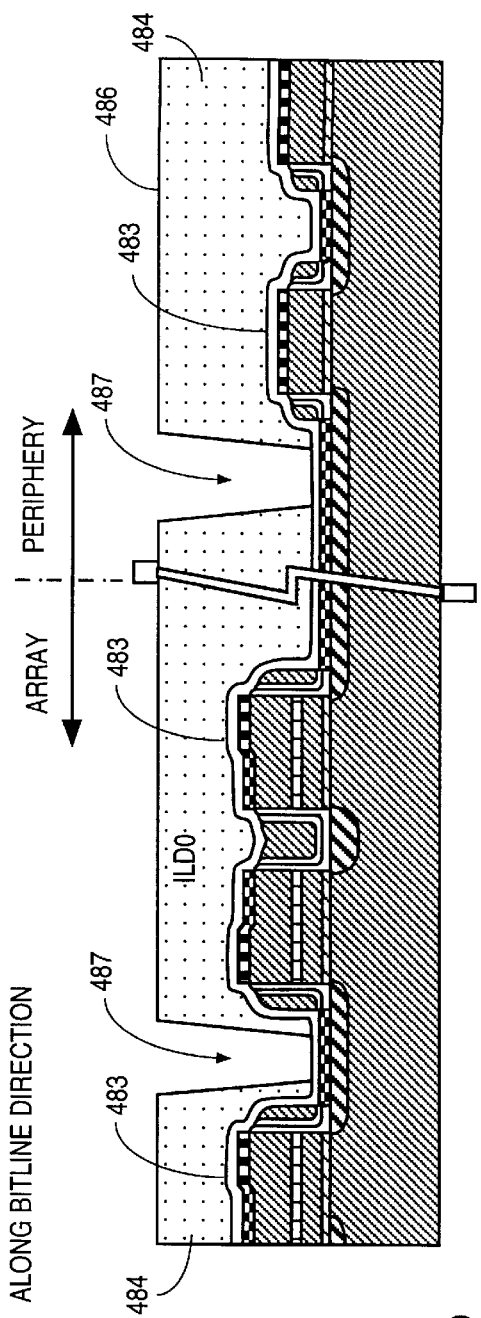
FIG. 32 is an illustration showing the etching of contact openings down to the etch stop layer of the substrate of FIG. 31.

In an embodiment of the present invention contacts are formed by forming a photoresist mask 485 over interlayer dielectric 484 which defines locations where contacts are desired as shown in FIG. 32. Using mask 485, contact holes 487 are then etched through interlayer dielectric 484 down to etch stop layer 483 with an anisotropic etchant which preferentially etches (>20:1) interlayer dielectric 484 as compared to etch stop layer 483. The etch stop layer protects underlying features such as the shallow trench isolation regions from the contact etch. This allows contact openings 483 to be partially positioned over diffusion regions and partially positioned over STI regions without concern for etching away the STI regions. In this way an over etch can be used to insure all openings across the substrate are cleared without the fear of etching into any underline isolation regions. The use of unlanded contacts removes the necessity of directly aligning the contact opening 487 to the isolation regions and enables alignment of the contacts to the gate which reduces the cell length.

Figure 33:
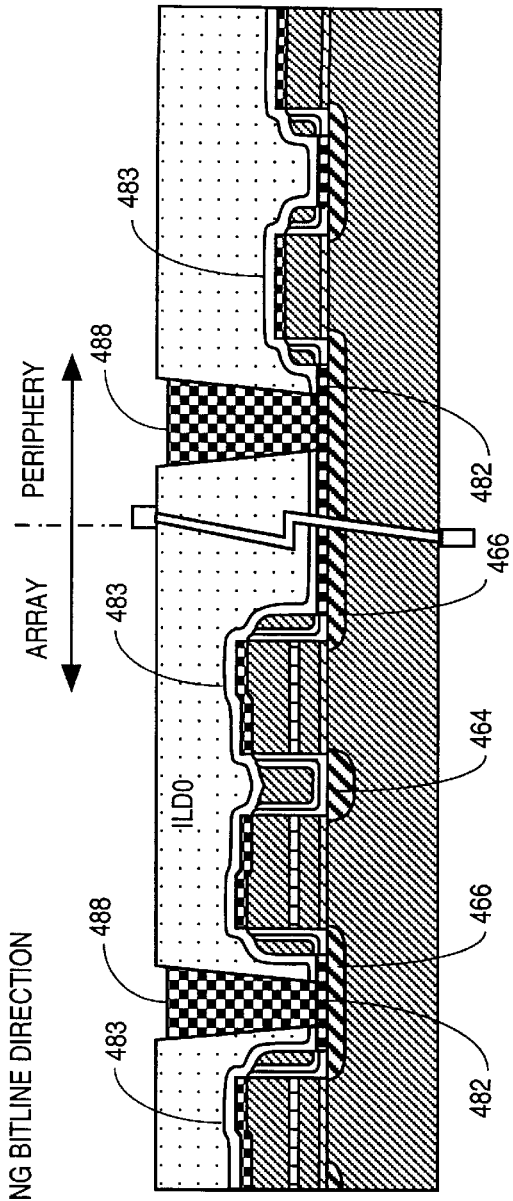
FIG. 33 is an illustration of a cross-sectional view taken along the bitline direction showing the formation of electrical contacts in the substrate of FIG. 32.

After all contact openings have reached etch stop layer 483 the etch is switched to an etch which preferentially etches the etch stop layer 483 as compared to the shallow trench isolation regions. The mask is then removed and a barrier layer such as but not limited to titanium/titanium nitride is blanket deposited over the interlayer dielectric and into the contact openings. Next, a tungsten film can be blanket deposited by chemical vapor deposition over the barrier layer and into the formed contact openings. The tungsten film is formed to a thickness which completely fills the contact openings. The tungsten film and the barrier layers can then be chemically mechanically polished back to remove the films from the top surface of interlayer dielectric thereby form Ti/TiN/W contacts 488 as shown in FIG. 33.

Figure 34:
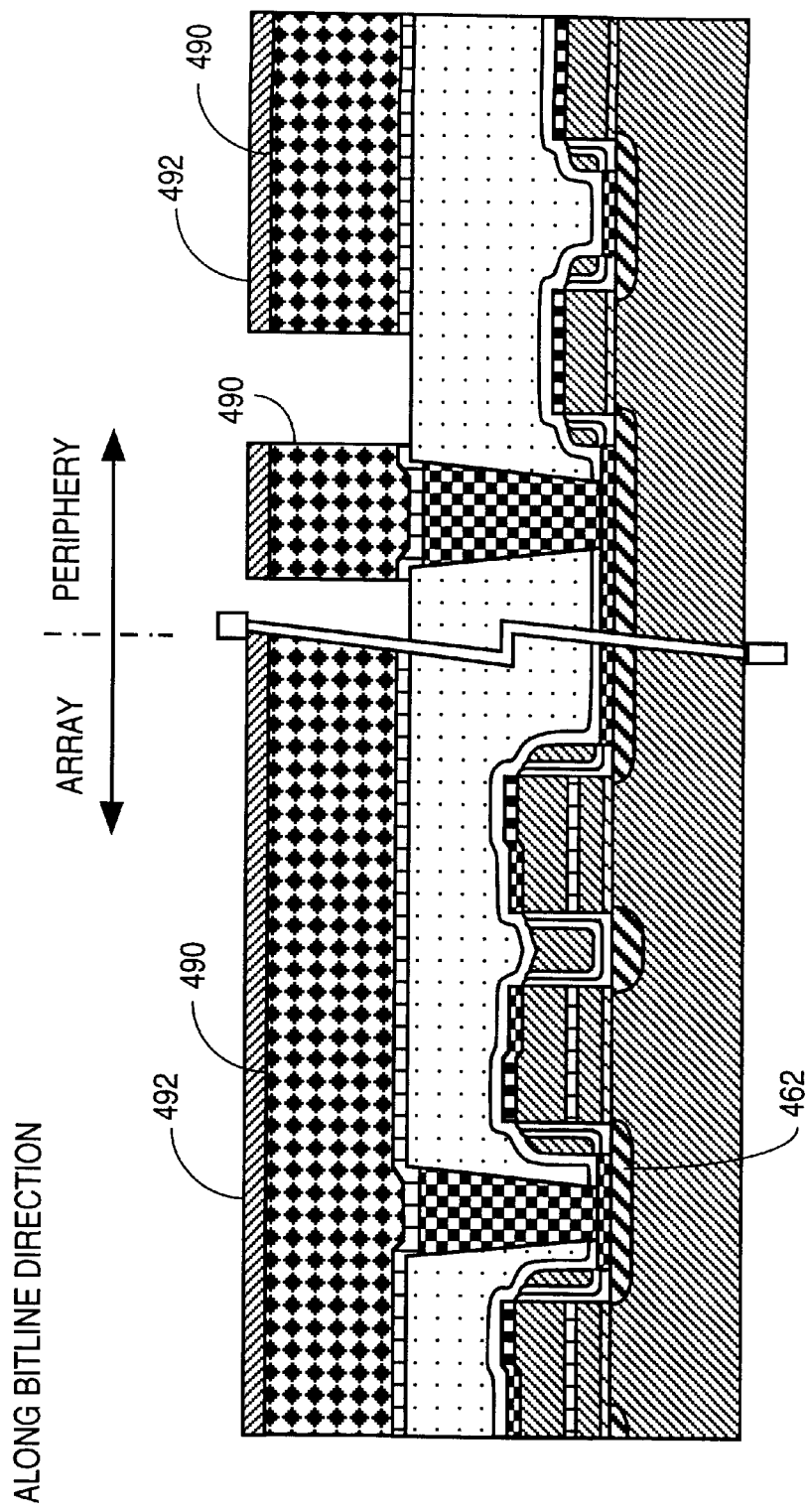
FIG. 34 is an illustration of a cross-sectional view taken along the bitline direction showing the formation and patterning of a first level of metallization on the substrate of FIG. 33.

Next, as shown in FIG. 34, taken along the bit line direction a first level of metallization such as aluminum is blanket deposited by any well known technique such as sputtering over the planar surface of ILD 484. Metal film 490 may or may not include barrier layer such as titanium and/or a capping layer such as titanium/titanium nitride if desired. In an embodiment of the present invention a hard mask 492, is formed over the metal film 490. The hard mask 492 is formed of a material, such as silicon nitride, which does not erode in the presence of the metal etchant. The hard mask is first patterned with well known photolithography and etching techniques in the patterned desired for metal 1. The hard mask is then used as a mask to etch metal film 490. Because hard mask 490 does not erode when exposed to the metal etchant, the mask profile is not degraded enabling the etching of narrow high density metal lines.

Patterned metal 1 can be used to form bit lines in the array portion which contact the shared drains through contact 488 as shown in FIG. 34. The back end processing techniques can be continued to add as many levels of metallization as desired to interconnect the various devices and memory cells fabricated on substrate 400. After the last level of metallization is formed and patterned well known passivation films are formed in order to hermetically seal the integrated circuit. At this point the fabrication of a nonvolatile integrated circuit in accordance with the present invention is complete.

We claim:

1. A nonvolatile memory cell comprising:
    a pair of spaced apart shallow trench isolation regions formed in a substrate and defining a substrate active region there between;
    a tunnel dielectric formed on said substrate active region;
    a floating gate formed on said tunnel dielectric and between said pair of spaced apart shallow trench isolation regions;
    a dielectric layer on said floating gate;
    a control gate formed on said dielectric; and
    a source region and a drain region formed in said substrate active region on opposite sides of said floating-gate, wherein said source region is coupled to a common source rail formed through said pair of spaced apart shallow trench isolation regions.

2. The nonvolatile memory cell of claim 1 further comprising a contact formed on said drain region and on one of said shallow trench isolation regions.

3. The nonvolatile memory cell of claim 1 wherein said floating gate has a work function of greater than 4.1 electron volts.

4. A nonvolatile memory cell comprising:
    a pair of spaced apart isolation regions formed in a substrate and defining a substrate active region there between;
    a tunnel dielectric formed on said substrate active region;
    a floating gate formed on said tunnel dielectric, said floating gate having a work function of greater than 4.1 electron volts;
    a dielectric layer on said floating gate;
    a control gate on said dielectric layer;
    a source region and a drain region formed in said substrate and on opposite sides of said floating gate; and
    a contact formed on said drain region and on one of said isolation regions.

5. The nonvolatile memory cell of claim 4 further comprising a common source rail connected to said source region.

6. The memory cell of claim 4 wherein said floating-gate is p-type polysilicon.

7. The memory cell of claim 6 wherein said p-type polysilicon floating gate is doped with boron atoms to a doping density of $1 \times 10^{17}$–$1 \times 10^{20}$ atoms/cm$^3$.

8. The cell of claim 4 wherein said floating-gate is self-aligned between said pair of spaced apart isolation regions.

9. The cell of claim 4 wherein said pair of spaced apart isolation regions are shallow trench isolation regions.

* * * * *

UNITED STATES PATENT AND TRADEMARK OFFICE
CERTIFICATE OF CORRECTION

PATENT NO. : 6,518,618 B1
DATED : February 11, 2003
INVENTOR(S) : Fazio et al.

It is certified that error appears in the above-identified patent and that said Letters Patent is hereby corrected as shown below:

<u>Column 9,</u>
Line 21, delete "comers", insert -- corners --.
Line 23, delete "Comer", insert -- Corner --.

<u>Column 17,</u>
Line 12, delete "NMOS", insert -- nMOS --.

Signed and Sealed this

Tenth Day of June, 2003

JAMES E. ROGAN
*Director of the United States Patent and Trademark Office*